United States Patent
Eto et al.

(10) Patent No.: US 10,453,695 B2
(45) Date of Patent: Oct. 22, 2019

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Soichiro Eto, Tokyo (JP); Takeshi Ohmori, Tokyo (JP); Tatehito Usui, Tokyo (JP); Satomi Inoue, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/714,181

(22) Filed: Sep. 25, 2017

(65) Prior Publication Data

US 2018/0277377 A1  Sep. 27, 2018

(30) Foreign Application Priority Data

Mar. 21, 2017  (JP) .................. 2017-053916

(51) Int. Cl.
| | | |
|---|---|---|
| *H01L 21/3065* | (2006.01) | |
| *H01J 37/244* | (2006.01) | |
| *H01L 21/67* | (2006.01) | |
| *H01L 21/66* | (2006.01) | |
| *H01J 37/32* | (2006.01) | |
| *H01L 21/02* | (2006.01) | |

(52) U.S. Cl.
CPC ........ *H01L 21/3065* (2013.01); *H01J 37/244* (2013.01); *H01J 37/32009* (2013.01); *H01L 21/02002* (2013.01); *H01L 21/67259* (2013.01); *H01L 22/26* (2013.01); *H01J 37/32963* (2013.01); *H01L 21/02104* (2013.01)

(58) Field of Classification Search
None
See application file for complete search history.

(56) References Cited

U.S. PATENT DOCUMENTS

| | | |
|---|---|---|
| 6,160,621 A | 12/2000 | Perry et al. |
| 6,287,980 B1 | 9/2001 | Hanazaki et al. |
| 7,718,538 B2 | 5/2010 | Kim et al. |
| 2014/0131314 A1 | 5/2014 | Ando et al. |

FOREIGN PATENT DOCUMENTS

| | | |
|---|---|---|
| JP | 11-260799 A | 9/1999 |
| JP | 2000-306884 A | 11/2000 |
| JP | 2004-507070 A | 3/2004 |
| JP | 2010-519758 A | 6/2010 |
| JP | 2014-099336 A | 5/2014 |

*Primary Examiner* — Stephanie P Duclair
(74) *Attorney, Agent, or Firm* — Mattingly & Malur, PC

(57) ABSTRACT

A plasma processing apparatus processes a film layer to be processed disposed in advance on a surface of a wafer by using a plasma being switched on and off in a processing chamber in predetermined cycles and periods and includes a detection control unit for detecting a processing amount of the film layer on the surface of the wafer. The detection control unit includes a light source unit, a detection unit, and a film thickness/depth calculation unit. This detection control unit detects a plurality of times an amount indicating the intensity of light on a sample surface at predetermined cycles during a period in which the plasma is switched off while the wafer is being processed and detects a processing amount of the film layer on the sample surface by using the detected amount indicating the light intensity.

5 Claims, 13 Drawing Sheets

PLASMA PROCESSING APPARATUS AND PLASMA PROCESSING METHOD

BACKGROUND OF THE INVENTION

1. Field of the Invention

The present invention relates to a plasma processing apparatus and a plasma processing method and in particular relates to a technique effective for detecting a processing state in a film layer being processed.

2. Description of the Related Art

In the manufacture of semiconductor devices, various components and wirings for interconnecting the components are formed on a surface of a wafer. These are formed by repeating film formation of various materials such as conductors, semiconductors, and insulators and removal of unnecessary portions. As a process for removing unnecessary portions, dry etching using plasma is widely used.

In such a dry etching apparatus using plasma, the plasma is formed by ionizing a reactive gas for processing introduced into a processing chamber disposed inside a vacuum vessel by using an electric field or a magnetic field at a predetermined frequency, for example, a high frequency band of 10 MHz or more, and the dry etching apparatus processes a film layer on a surface of a substrate-like sample such as a semiconductor wafer to be processed by being brought into contact with the sample surface by using the plasma.

Anisotropic or isotropic etching is performed by a physical reaction such as sputtering by ions in the plasma and chemical reaction by radicals, which are generated during this processing. Further, by using these isotropic and anisotropic processing properly by a user of the apparatus, circuit components and wirings of various structures for semiconductor devices are formed on a wafer surface to be processed.

In the case where a shape and dimensions after processing obtained by such plasma etching are different from the intended shape and dimensions, the various circuit components obtained after processing cannot perform intended functions, and it is considered that the semiconductor device is defective.

Therefore, a process monitoring technique has been proposed in which a processing state is monitored even during etching processing using the plasma, and an actual processing state is detected such that conditions and progress of processing can be stabilized.

For example, the process monitor detects the size of a remaining film thickness of a film formed in advance on a wafer and the depth of a groove and a hole formed on a wafer, by detecting the magnitude of intensity of reflected light from the wafer surface during processing using plasma and a change with the elapse of the time. The process monitor is called a film thickness/depth monitor and has been used for determining an end point of etching processing.

As examples of such techniques, the techniques disclosed in, for example, JP-11-260799-A, JP-2004-507070-A, JP-2010-519758-A, JP-2014-9936-A, and JP-2000-306884-A are known. JP-11-260799-A describes a method for improving processing accuracy by using this film thickness/depth monitor. JP-11-260799-A discloses a technique for detecting immediately before the film to be processed is completely removed by using the film thickness/depth monitor using plasma light as a light source and terminating the etching processing.

JP-11-260799-A further discloses that etching processing is performed on a portion to be processed and a portion to be not processed after switching to a condition for highly selective etching. Thus, it is disclosed that complete removal of a film to be processed can be realized without variations in processing within a wafer surface while shortening the overall processing time.

In addition, JP-2004-507070-A describes a technique for improving the accuracy of detection of film thickness and depth by a film thickness/depth monitor. JP-2004-507070-A discloses that an external light source is used instead of plasma light as a light source with which a wafer is irradiated.

With this configuration, fluctuations in a light amount of the light source are reduced, and the film thickness and depth are detected with high accuracy. Further, a technique is also disclosed which measures wafer reflected light at the time of external light irradiation and external light non-irradiation, removes the influence of plasma light by measuring the difference, and reduces noise of the film thickness/depth monitor.

On the other hand, in recent years, miniaturization and three-dimensional structure of a semiconductor device are advanced along with high functionality, and the need for further highly accurate plasma etching is increasing. As a technique for realizing such highly accurate etching processing, a technique is known which forms and extinguishes plasma in a processing chamber in predetermined cycles and periods and increases and decreases the intensity of the plasma by repeating supply and stop of the supply of an electric field or a magnetic field to form the plasma into the processing chamber in the predetermined cycles and periods or increase and decrease of the magnitude of the supply.

Generally, such periodically intermittent supply of the electric or magnetic field is realized by pulse-width modulation in which a signal instructing a power source or output from the power source is turned on/off in a pulse-like state in a predetermined period.

For example, JP-2010-519758-A describes a method for reducing etching variation (micro loading) caused by pattern density on a wafer by performing etching processing using pulsed plasma.

Techniques described in JP-2014-9936-A and JP-2000-306884-A are known as a technique of a process monitor for detecting a processing state during processing using such the pulsed plasma. JP-2014-9936-A discloses a technique for detecting a temporal change in the amount of received light with a specific wavelength generated during processing and determining the end point of etching processing based on the detected change.

Particularly, a technique is disclosed which forms plasma by constantly keeping a time when the plasma is on (time when an electric field for forming plasma is supplied) to reduce adverse effects on detection of the amount indicating a state of processing detected from the amount of light emission by a temporal change in the light emission amount along with on/off of pulsed plasma which is repeatedly formed and extinguished by the electric field in which output is repeatedly turned on/off and increased and decreased in a predetermined cycles and at a predetermined time.

As a result, it is possible to reduce the influence received from detection results of the light emission from the inside of the processing chamber during the period when the plasma is off, to suppress deterioration of the accuracy of detection of a change in the amount of light emission in the processing chamber during the period when the plasma is on, and to enable accurate determination of the end of etching processing.

JP-2000-306884-A describes a technique to perform light detection that detects the amount and quality of plasma light emission in synchronization with the time when the plasma is on (a period during which an electric field supplied in pulse form is on is started).

In this technique, the amount of light emission in a processing chamber being processed is always detected during a period in which the plasma is formed (during which the plasma is on). As a result, it is possible to reduce received influence, detect a processing state during processing, and determine the end of the processing with high accuracy.

SUMMARY OF THE INVENTION

However, the above-described techniques have a problem since the following points are insufficiently considered.

That is, as etching processing becomes highly accurate, it is desired to improve the accuracy of detection of film thickness/depth by the film thickness/depth monitor. Main noise that degrades the detection accuracy of the film thickness/depth monitor is fluctuation in the light amount of plasma. Therefore, it is essential to completely remove the plasma light fluctuation to improve the accuracy of the film thickness/depth monitor.

FIG. 11 is a graph schematically indicating a change in the intensity of plasma light emission with respect to a change in a detection time during a period of etching processing of a sample to be processed in a plasma processing apparatus as studied by the inventors of the present invention.

FIG. 11 indicates an example of a film thickness/depth monitor signal. In the example, noise originally containing a change in the intensity of light emission from a wafer surface and a processing chamber during etching processing is eliminated. In this example, processing starts at time 0 s, and the detected light amount increases or decreases as the etching processing progresses (decrease in film thickness to be processed).

In the above-described technique, a result of detecting the amount of light emission during the etching processing period indicating such the change at a plurality of predetermined times is used to detect the remaining thickness of a film to be processed or the processed amount (etching depth) and to determine arrival at the end point.

Here, the amount of reflected light periodically changes with one cycle of a film thickness $\lambda/(2n*\cos\theta)$ expressed by using a refractive index $n$ to be processed, a wavelength $\lambda$ to be measured, and an incidence (detection) angle $\theta$ of light. Therefore, the signal intensity in the film thickness/depth monitor is defined as a reflected light amount change $\Delta I$ (amplitude in one cycle of a reflected light amount change)/$\{\lambda/(2n*\cos\theta)\}$ per film thickness of 1 nm.

Practically possible values of each parameter are $\Delta I \leq 100\%$, $\lambda \geq 300$ nm, $n \leq 4$, $0° \leq \theta \leq 90°$, and therefore the signal intensity $\leq 100\%/\{300\ nm/(2*4*\cos))(0°))\}=2.7\%$ (per detection film thickness of 1 nm). From here, it is clear that the signal strength is extremely small, and it is necessary to suppress noise, to detect the film thickness/depth with high accuracy such as 1 nm.

Next, FIG. 12 is a graph schematically indicating a change in the intensity of plasma light emission with respect to a change in time detected during a period of etching processing of a sample to be processed in a plasma processing apparatus as studied by the inventors of the present invention.

In particular, in FIG. 12, a typical example of a change in the intensity of light emission from plasma ignited and formed at the time 0 s is indicated in a shorter time than that in FIG. 11. In this drawing, each point indicated on the graph is the average value of the intensity of light emission at every 0.1 s detected at each corresponding time.

During a period from the time 0 s to the time 1 s immediately after the plasma is ignited (turned on), a plasma state is unstable since the intensity of light emission significantly changes. Therefore, a change in the light amount normalized by the average value is 46.2% which is significantly large.

Generally, from the time 1 s at which the plasma state can be regarded as stable, in addition to a gradual change over a time 5 s, an early cycle change is also detected, and the magnitude of the change in this period is 7.2% of the whole.

As a result, fluctuation of the amount of light emission of plasma is very large with respect to a change rate of the signal intensity of 2.7% (per 1 nm of the detected film thickness) indicating a change in the intensity of light emission obtained from a wafer surface during processing. Therefore, it can be said that it is essential to remove noise components of the light emission generated from the plasma itself to detect remaining film thickness and depth or an end point of the processing with high accuracy. Furthermore, the influence of fluctuation of the intensity of light emission of the plasma appears remarkably in the case where the detection period is short.

FIGS. 13A and 13B are graphs schematically indicating a change in the intensity of plasma light emission with respect to a change in time detected during a period of etching processing of a sample to be processed in a plasma processing apparatus as studied by the inventors of the present invention.

In particular, as in FIG. 12, FIGS. 13A and 13B indicate a change in the intensity of light emission from the inside of a processing chamber during a period shorter than that in FIG. 11 immediately after plasma is ignited. FIGS. 13A and 13B each indicate a fluctuation with the elapse of time of the light amount when data detected at a time corresponding to each point indicated on a graph is the average value for every 0.01 s and 0.001 s, respectively.

In the example of the drawing, even in a period during which the plasma is regarded as stable, when the detection time interval is shortened to 0.01 s and 0.001 s, fluctuation of the intensity of light emission increases from 24.3% to 47.6%. These fluctuations are noise having an amount of 10 times or more of the above-described signal intensity change rate of 2.7%. Such noise makes it extremely difficult to determine the film thickness and the end point with high accuracy.

Further, the intensity fluctuation in light emission of plasma further remarkably appears in pulsed plasma in which a time during which a plasma is switched on is short.

FIGS. 14A and 14B are graphs schematically indicating a change in the intensity of plasma light emission with respect to a change in time detected during a period of etching processing of a sample to be processed in a plasma processing apparatus as studied by the inventors of the present invention.

Each of FIGS. 14A and 14B indicates a result of detecting the intensity of light emission from a plasma formed in the period and a change in the intensity under the condition that a time during which the plasma is switched on (an electric field for plasma formation is supplied to a space for plasma formation) is 10 ms and 1 ms.

In FIG. 14A, a magnitude of the intensity of light emission during the period when a plasma is switched on is varied in each period (each on-period of a pulsed electric field), and a ratio of the magnitude of the fluctuation is 45.1% which is large. This ratio is larger than a fluctuation ratio every 10 ms in a period in which the plasma indicated in FIG. 13A is regarded as stable.

This means that each time corresponding to detected signals indicated during each on-period is all within a period during which supply of an electric field (on-period) starts, or the plasma immediately after being ignited is unstable. It is considered that a plurality of parameters at the time when the plasma is ignited differ for each on-period, and as a result, a state of such as a density, intensity, or distribution of the plasma at the time differs.

The influence of variation in a plasma state increases as the plasma on-period is shortened, and in the example of FIG. 14B in which the plasma on-period is 1 ms, a fluctuation ratio of the light emission intensity is further increased to 120.6%.

Consequently, in the case where a pulsed plasma is formed, the intensity fluctuation of light emission of the detected plasma is significantly large, and it is further difficult to detect the remaining film thickness during processing or an end point of the processing with high accuracy.

For the above-described reasons, in the case of processing a sample by using pulsed plasma, intensity fluctuation of plasma light emission increases, it becomes difficult to detect a processing state with high accuracy during processing, and reproducibility and yield of the processing of a sample are lowered. In the above-described technique, the above-described problem has not been considered.

An object of the present invention is to provide a technique capable of providing a plasma processing apparatus and a plasma processing method with improved yield.

The above-described object, other objects, and new characteristics of the present invention will be clarified by the description herein and attached drawings.

Outline of representative inventions in the inventions disclosed in the present application will be briefly described as follows.

That is, a typical plasma processing apparatus includes a processing chamber disposed inside a vacuum vessel and a sample stand disposed inside the processing chamber and holding a sample. By using a plasma switched on and off in the processing chamber according to predetermined cycles and periods, the plasma processing apparatus processes a film layer to be processed disposed in advance on a surface of the sample.

This plasma processing apparatus includes a detection control unit for detecting a processing amount of a film layer on a surface of a sample. The above-described detection control unit detects, a plurality of times, the amount indicating the intensity of light on a surface of a sample at predetermined cycles during a period in which plasma is switched off while the sample is being processed and detects the processing amount of the film layer on the sample surface by using the detected amount indicating the light intensity.

Effects obtained by representative inventions in the inventions disclosed in the present application will be briefly described as follows.

(1) It is possible to suppress the adverse influence of a change in the intensity of light emission of pulsed plasma and to detect a processing state with high accuracy during processing.

(2) The yield can be improved according to the above (1).

DESCRIPTION OF THE PREFERRED EMBODIMENT

An Embodiment of the present invention will be described below with reference to the drawings.

A plasma processing apparatus according to the embodiment is a semiconductor plasma processing apparatus which etches a film layer to be processed by using plasma formed in a processing chamber. The film layer has a film structure which becomes a circuit of a semiconductor device disposed in advance on a surface of a substrate-like sample, such as a semiconductor wafer, disposed in the processing chamber in a vacuum vessel, and the film structure includes a plurality of layers including a mask defining a pattern of the circuit.

The plasma processing apparatus according to the embodiment has a function to detect the intensity of light received from the inside of the processing chamber which receives light while the sample is being processed and a change in the intensity and to determine, by using this detected result, a processing amount, such as the remaining film thickness of the film layer during processing, and an amount of processed depth, and arrival to an end point of the processing.

In addition, the plasma processing apparatus according to the embodiment repeatedly supplies and stops supplying an electric field or a magnetic field to form plasma into the processing chamber in predetermined cycles and periods or repeatedly increases and decreases the magnitude of the supply. As a result, the plasma processing apparatus forms and extinguishes the plasma in the processing chamber in the predetermined cycles and periods and increases and decreases the intensity of the plasma.

Further, in the embodiment, to form such the plasma, periodically intermittent supply of an electric field or a magnetic field is repeated by switching a period in which an amplitude of a signal instructing a power supply or output from the power supply is increased (switched on) in a pulse form in a predetermined period and a period in which the amplitude is reduced (or 0 or equivalent to 0 (switched off)). That is, a pulse width is modulated so as to be switched on/off. In this manner, in the plasma processing apparatus according to the present embodiment, pulsed plasma is formed in the processing chamber.

On the other hand, intensity fluctuation of light emission of the pulsed plasma is caused by the intensity and density of the plasma or unstable distributions thereof immediately after the plasma is ignited and formed from a extinguished state or the plasma intensity is increased from a relatively low level to a high level (plasma on).

Figure 12:
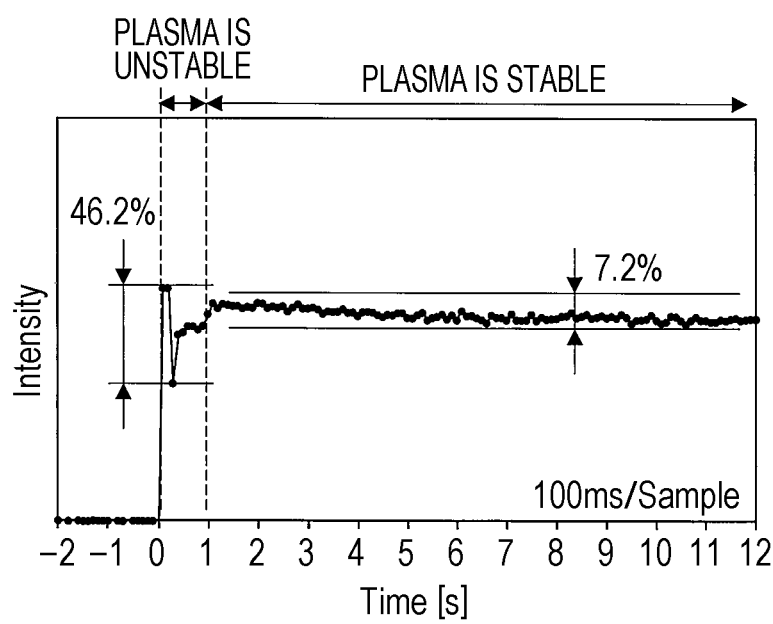
FIG. 12 is a graph schematically indicating a change in the intensity of plasma light emission with respect to a change in time detected during a period of etching processing of a sample to be processed in the plasma processing apparatus as studied by the inventors of the present invention.
Figure 13A:
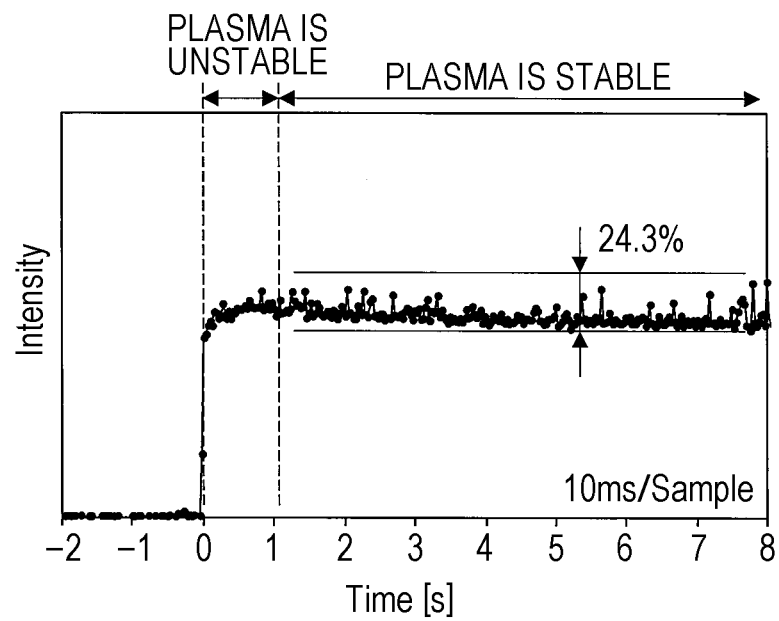
FIGS. 13A and 13B are graphs schematically indicating a change in the intensity of plasma light emission with respect to a change in time detected during a period of etching processing of a sample to be processed in the plasma processing apparatus as studied by the inventors of the present invention.
Figure 13B:
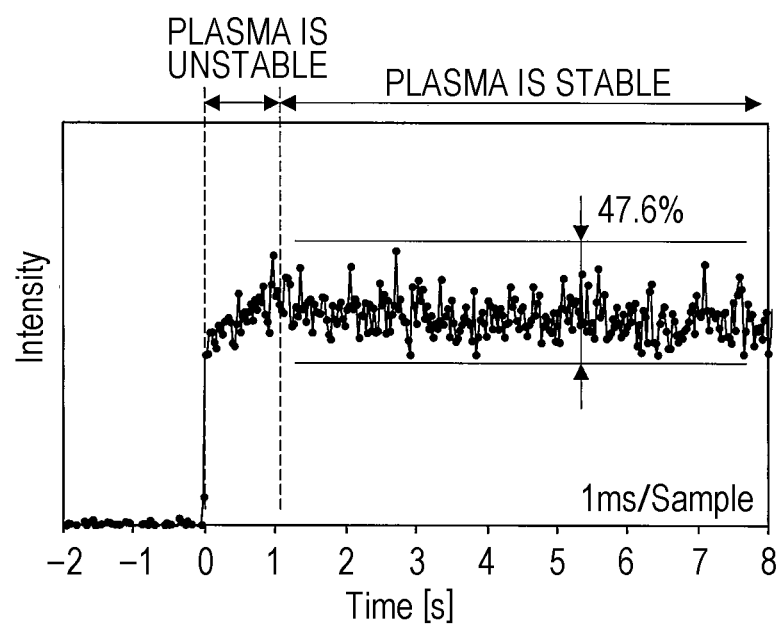

For example, as indicated in FIGS. 12 and 13A and 13B, a state such as the intensity of plasma is unstable at the time 0 s to 1 s after the plasma is switched on, and when the time is within 0 to 1 s, a state of the plasma is significantly varied per pulse in the case of within the time 0 to 1 s, and the light emission intensity significantly varies.

Such a period in which the plasma is unstable is varied by various parameters relating to discharge, such as a device structure, a discharge system, a gas type, a pressure, exhaust capability, and gas exciting power (applied voltage and microwave power).

However, the period during which the plasma is unstable does not become equal to or less than a matching speed of a matching device used to supply a high frequency power and a microwave power used for converting a gas into a plasma.

The matching device changes an impedance of a high frequency power and a waveguide load of the microwave according to a plasma state of the gas and always absorbs the power to the gas most efficiently. Since this matching device primarily mechanically operates, a time to achieve the matching is about 0.5 s at the shortest, and usually several seconds are required. Consequently, the inventors have considered that the plasma exists for at least 0.1 s during an unstable period immediately after plasma is ignited.

Consequently, the intensity of light emission of a pulsed plasma is varied by at least a matching device for 0.1 s immediately after start of the plasma on-time. As indicated in FIGS. 13A and 13B, in the pulsed plasma in which the on/off period is repeated with a cycle shorter than 0.1 s during which the plasma is unstable, variation in the intensity of light emission in each on-period further increases since a gas dissociation state, pressure, electron density, electron temperature, and the like are not stable in addition to the influence of the matching device.

To solve such a problem, the inventors of the present invention have obtained the knowledge to solve the above-described problems by detecting a plurality of times the intensity of light emission in a processing chamber and a change in the intensity at a predetermined cycle during a period in which the pulsed plasma is switched off.

A semiconductor manufacturing apparatus according to the embodiment has a configuration based on this knowledge. The semiconductor manufacturing apparatus has a function to determine a processing state of a surface of a sample disposed in a processing chamber from the intensity of light emission or a change in the intensity, which are obtained by detecting the light emission from the inside of the processing chamber a plurality of times at predetermined cycles over a period in which a plasma is extinguished, or a plasma decreased in intensity is formed, repeatedly, when a plasma is repeatedly formed and extinguished in predetermined cycles and periods in the processing chamber or a plasma with a predetermined large and small intensity is formed.

Further, in the above-described configuration, in the case of processing by using pulsed plasma, in the off-period in plasma repeatedly switched on/off at specific cycles, when a period of the intensity of plasma light emission is 0 or short enough to be regarded as 0, in a period in which the intensity of a plurality of off-periods is small, the light emission intensity or a change in the intensity is detected.

Even in processing using continuous plasma, in a period of temporarily extinguishing the plasma (plasma off-period), the same effect can be obtained by performing the detection in a plurality of periods of the intensity in the case where a period of the intensity of light emission of the plasma is 0 or small enough to be regarded as 0.

Film thickness/depth of a sample being processed or an end point of processing may be detected by using a result of detecting light from the inside of a processing chamber by introducing light from the outside into the processing chamber in a plurality of periods in which the intensity of light emission is 0 or smaller.

In this case, the intensity of reflected light or a change in the intensity may be detected by receiving, outside the processing chamber, light from the outside emitted to and reflected by the surface of a sample being processed. In the embodiment having the above-described configuration, it is possible to realize film thickness/depth monitoring and end point determination with high accuracy.

Figure 1:
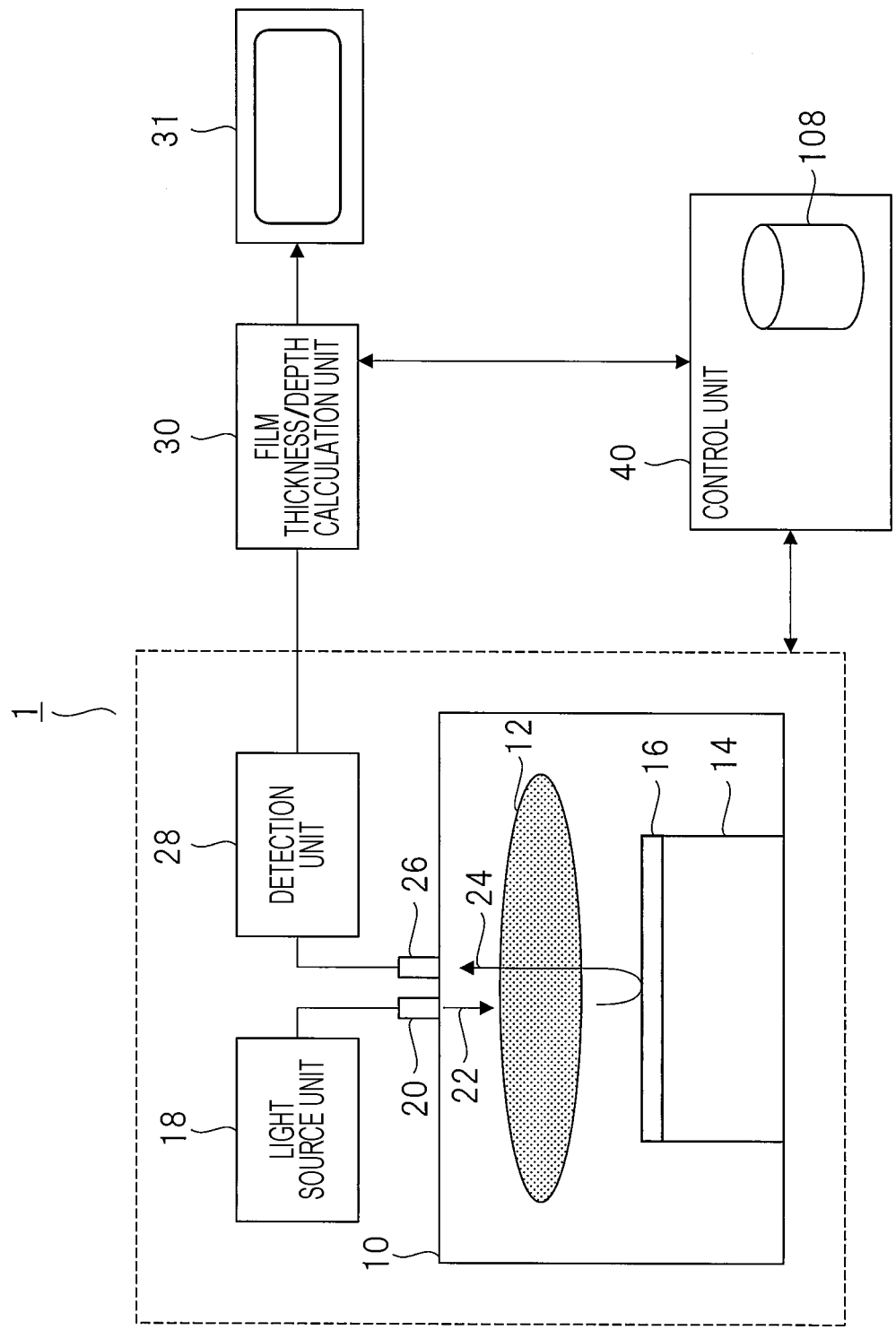
FIG. 1 is a vertical cross-sectional diagram schematically indicating an outline of a configuration of a plasma processing apparatus according to an embodiment.

In the present embodiment, the number of times of detecting light emission from the inside of the processing chamber in each of a plurality of plasma off-periods is arbitrary set by selecting, by a user, a detection cycle according to detection accuracy and an object of the detection and by inputting a command signal to the control unit 40 in FIG. 1 for adjusting an operation of a semiconductor manufacturing apparatus or a plasma processing apparatus.

According to the detection for each set cycle, if it is possible to perform detection once during each plasma off-period, a processing state of the sample can be detected at a time of every plasma-off period (and a cycle of pulsed plasma).

In addition, when detection can be performed more than once during the plasma off-period, by using data obtained by averaging results of detection at the time of each cycle during the same off-period, the influence of noise included in the intensity of light emission in the off-period and a change in the intensity can be reduced, and detection of the processing state with higher accuracy can be realized.

In the semiconductor manufacturing apparatus according to the present embodiment, in the case where the on/off cycle of pulsed plasma formed in the processing chamber is shorter than the minimum detectable period of a detector for detecting light emission, a detection cycle of the detector may be matched with a plasma off-cycle.

In this case, during the time of each detection cycle, at least one or more plasma off-periods exist, and in this off-period, light from the processing chamber is not detected. However, all of a plurality of detections are periodically performed at the time of the plasma off-period, and it becomes possible to detect a state and an amount of etching processing such as the remaining film thickness at a plurality of times obtained from the detection results.

Depending on conditions of sample processing, film deposition occurs on a sample surface during the plasma off-period, and the film thickness increases also during this period. In this case, by detecting the remaining film thickness and the processing amount for a plurality of times during the plasma off-period, changes in the processing amount and the film thickness during plasma-off are detected.

Light to be emitted onto a sample to be processed in a processing chamber from the outside of the processing chamber during processing may be, for example, continuous light including wavelengths from ultraviolet to infrared. In this case, interference light due to reflected light from a surface and a bottom surface of a film layer being processed can be detected for each of a plurality of wavelengths, and the intensity of the interference light having the wavelength as a parameter or a change accompanying the time change can be detected from the interference light, and it becomes possible to detect the remaining film thickness or the depth of processing by using the detected intensity and change.

Further, external light having single or plural wavelengths may be used instead of continuous light. By using a specific wavelength with narrow wavelength line width, noise superimposed on the light from the processing chamber due to widening the wavelength can be reduced, and the accuracy of intensity data of the detected light emission can be improved.

Furthermore, when a laser is used as a light source of external light, even with respect to shapes such as (deep) grooves and holes having large aspect ratios formed in a film layer to be processed on a sample surface due to high coherency, it becomes possible to detect interference light from the film layers with high resolution or accuracy. In this case, in the case of using a semiconductor laser, transmission wavelength may fluctuate (mode hop) due to return light or the like, and the fluctuation is noise of a film thickness/depth monitor signal.

In this case, by modulating drive current of the semiconductor laser with high frequency, high frequency superimposition for suppressing the mode hopping or the like may be used. In the case of using a single wavelength, it may be unnecessary to use a spectrometer on a detection side, and it is also possible to simplify a measurement system.

External light (reference light) is emitted so as to detect reflected light from the sample surface during the plasma off-period. In this case, the external light may be emitted in synchronization with a cycle or time of detection of light from the inside of the processing chamber, or may be constantly emitted over a predetermined processing period.

If the external light irradiation is not performed during the plasma on-period, it can be expected to extend the life of an external light source. In addition, in the case of improving FTM measurement accuracy by applying a lock-in amplifier, external light may be emitted after a light amount is modulated.

The reflected light is detected only when the light intensity of a wavelength to be detected and a change in the intensity can be detected. When the external light is continuous light, an amount of the intensity of light of each wavelength can be obtained by using a spectroscope.

In the case where the external light has a specific wavelength and in the case where the external light is continuous light, and the reflected light to be detected has a specific wavelength, an optical system is configured so that a target wavelength can be detected, and instead of a spectrometer, a photodetector or the like may be used as a detector.

The photodetector can perform data sampling at a higher speed than that of a spectrometer. Therefore, by using the photodetector, it becomes possible to measure the film thickness and depth with high temporal resolution. In addition to the above, by using a charge coupled device (CCD) or a complementary metal oxide semiconductor (COMOS) sensor, the same function as in the spectrometer can be realized, and the CCD and the COMOS may be used as detectors.

In the present embodiment, an amount indicating a processing state, such as the remaining film thickness of a film layer to be processed during processing or the depth of processing is detected by comparing data as a result obtained by detecting the intensity of light from the inside of the processing chamber detected at a time per predetermined detection cycle and a change in the intensity and data indicating a relationship between the intensity of light detected in advance before processing of a sample being processed, or a change in the intensity, and a value of an amount of the remaining film thickness or depth.

That is, in the case where the data is obtained which indicates the intensity of interference light from the film layer with wavelengths with respect to a change in the remaining film thickness or the depth of the film layer to be processed as a parameter before starting processing of a sample or a change pattern of a change rate of the intensity, data of a plurality of specific wavelengths of the intensity (or a change rate of the intensity) of light from the inside of the processing chamber detected at a specific time during the processing and previously acquired data corresponding to the wavelength are compared, and the processing amount such as the film thickness corresponding to the data with the smallest difference among the previously acquired data or the depth of the processing is determined as the processing amount at a specific time.

Even when light containing a plurality of wavelengths or continuous light is used as external light, the intensity (or a change rate thereof) of light from the processing chamber for each of a plurality of wavelengths is detected at any time for each cycle of detection during processing. This detection result and data of each time or each film thickness of change patterns of the intensity (or change rate of the intensity) of the interference light with the above-described wavelengths with respect to the previously obtained time change (change in film thickness) as a parameter are compared, and a film thickness corresponding to the data with the smallest difference is determined as the film thickness (depth of processing) at the time.

In the case where a first differential value or a second differential value of the light amount change of each wavelength with respect to the film thickness/depth to be processed is acquired in advance, a first differential value or a second differential value of the light amount per wavelength with respect to the time of each detection result is obtained, and by comparing the value and previously acquired data, the film thickness/depth at the time may be specified.

A well-known pattern matching technique can be applied to compare data of a pattern indicating a change in the intensity (or change rate of the intensity) of interference light from a sample surface with a wavelength with respect to a change in time or a change in the film thickness acquired in advance as a parameter and data indicating the intensity or a change rate of the intensity of light with a plurality of wavelengths detected during processing. In addition, in the comparison, the difference is detected by selecting the smallest deviation among the deviations obtained by pattern matching between data of each of wavelengths within a predetermined allowable value.

Specific Embodiment

Hereinafter, a specific embodiment will be described with reference to FIGS. 1 to 10.

FIG. 1 is a vertical cross-sectional diagram schematically indicating an outline of a configuration of a plasma processing apparatus according to the embodiment.

A plasma processing apparatus 1 includes a processing chamber 10. The processing chamber 10 is a space disposed inside a vacuum vessel, a sample stand 14 is disposed inside the space, and a plasma 12 is formed in the space. The processing chamber 10 is a space having a cylindrical shape. An electric field generation unit which supplies a high frequency electric field with a predetermined frequency to the processing chamber 10 is disposed on an upper side of a circular ceiling surface of the space. A magnetic field supply unit such as a solenoid coil which supplies a magnetic field into the processing chamber 10 is disposed on the upper side or around the side periphery of the cylindrical shape.

Further, a plurality of introduction holes are disposed into which a gas for processing the wafer 16, which is a sample held and placed on the upper surface of the sample stand 14 inside the ceiling surface of the processing chamber 10. These introduction holes communicate with and connect to a gas introduction portion including a gas supply passage such as a pipe (not illustrated) and a flow rate controller (mass flow controller (MFC)) disposed above the gas supply passage.

An exhaust device such as a turbo molecular pump for evacuating gas and particles and reduce a pressure in the processing chamber 10 is disposed below a vacuum vessel incorporating the processing chamber 10. In addition, although not illustrated, an inlet of the exhaust device is communicated with an exhaust port which is an exhaust opening disposed on the bottom surface of the processing chamber 10 below the sample stand 14, and an exhaust control valve is disposed in the exhaust pipe passage therebetween to change an exhaust flow rate or an exhaust flow speed by increasing and reducing a cross sectional area of an inner flow passage.

In the present embodiment, a gas for etching processing is introduced from the gas introducing portion into the processing chamber 10 reduced in pressure by operation of the exhaust device. In a state in which a pressure in the processing chamber 10 is adjusted to a pressure suitable for starting processing by balancing the amount of exhaust gas and the amount of supplied gas, the high-frequency electric field and the magnetic field are supplied, and ionization or dissociation of atoms or molecules of the processing gas is caused by an interaction to form the plasma 12 in a space above the sample stand 14 in the processing chamber 10.

Charged particles in the plasma and particles of active species having high reactivity (activity) by dissociation are diffused or induced on an upper surface of the wafer 16, and etching processing (plasma processing) is performed to a film layer to be processed having a film structure disposed in advance on the surface of the wafer 16.

In the embodiment, operations of the plasma processing apparatus 1, such as the amount of processing gas introduced into the processing chamber 10, the amount of exhaust gas, ignition, generation and extinguishing of the plasma 12, the intensity and distribution of an electric field and a magnetic field therefor, transfer of the wafer 16 into and out of the processing chamber 10 and holding on the sample stand 14, and starting and stopping the processing by supplying and stopping supplying a second high-frequency power for forming a bias potential to a metallic disc-shaped electrode (not illustrated) disposed in the sample stand 14, are adjusted based on a command signal from the control unit 40 communicably connected to each component or device to perform the above operations and these units. In addition, the control unit 40 has a function to adjust synchronization and a timing between devices such that conditions for obtaining a result of etching processing desired by a user are obtained.

In the embodiment, the plasma 12 repeatedly switches the gas for processing by switching on/off the high frequency electric field from the electric field generating unit in predetermined cycles and periods, and ignition, formation, and extinguishment are repeated in a pulsed manner in the predetermined cycles and periods.

The plasma is also pulsed by temporally modulating introduction of etching gas. In the present embodiment, switching and repeating on/off of supply of high-frequency power from a power source in predetermined cycles and periods for forming the plasma 12 in a pulse form are performed in synchronizing with a pulsed signal indicating the cycle and period to be transmitted from the control unit 40 to an electric field formation unit or a magnetic field formation unit.

The plasma processing apparatus 1 has a configuration for detecting the processing amount such as the film thickness and the depth of the wafer 16 during processing. This configuration includes a light source unit 18, lenses 20 and 26, a detection unit 28, and a film thickness/depth calculation unit 30. The light source unit 18 includes a light source which emits external light into the processing chamber 10. The lens 20 is connected to the light source unit 18 by an optical fiber and forms a ceiling surface of the processing chamber 10, and external light is emitted in the processing chamber 10 through the lens. Similarly, the lens 26 forms the ceiling surface and receives light from the inside of the processing chamber 10. The detection unit 28 is connected to the lens 26 by an optical fiber and detects the intensity of the received light. The film thickness/depth calculation unit 30 detects a processing amount of the wafer 16 being processed from the detected light intensity or a change rate of the intensity. In addition, a detection control unit includes the light source unit 18, the detection unit 28, and the film thickness/depth calculation unit 30.

Light emitted from a light source of external light included in the light source unit 18 is introduced from the ceiling surface into the processing chamber 10 through the lens 20 by propagating through the optical fiber and is emitted on an upper surface of the wafer 16 as an irradiation light 22. Continuous light from ultraviolet to infrared is used as a light source of the light source unit 18. However, when a specific wavelength is used to detect the film thickness and depth, a light source of a specific wavelength may be used.

The emitted irradiation light 22 is collected by receiving, by the lens 26 for detection, a reflected light 24 as interference light reflected by the upper surface and the bottom surface of a film layer to be processed on the surface of the wafer 16 and interfered with both surfaces. Light from the lens 26 propagates inside the optical fiber and is introduced into the detection unit 28.

The detection unit 28 includes a spectroscope. Light introduced by the spectroscope is divided into a plurality of wavelengths, and the intensity of the light is detected for each wavelength. In the case of detecting film thickness/depth by using a specific wavelength, the detector may be not limited to a spectroscope, a photodetector, and the like may be used.

In this case, if the light introduced into the detection unit 28 has only a desired specific wavelength, a direct photodetector may be used. If continuous light is introduced, a mechanism for selecting only specific wavelengths by using a monochromator or the like may be provided in a front stage of the photodetector.

In the present embodiment, as indicated in FIG. 1, the lens 20 for introducing the irradiation light 22 from the light source unit 18 into the processing chamber 10, and the lens 26 which receives the reflected light 24 from the wafer 16 are disposed in an upper portion of the processing chamber 10 facing the wafer 16 with a distance therebetween.

To detect the reflected light 24 most efficiently, such that the irradiation light 22 from the lens 20 and the reflected light 24 received by the lens 26 are positioned on the same light axis, it is preferable that at least one of the optical axes is disposed to be inclined.

Configurations of the lenses 20 and 26 are not limited to the configuration indicated in FIG. 1, and as a completely coaxial configuration, the lenses 20 and 26 may be formed by one lens. In this case, a direction of the optical axis of the one lens is perpendicular to the wafer 16 so as to detect light vertically emitted from the upper side with respect to the wafer 16 and vertically reflected.

In addition, FIG. 1 discloses an example in which a pair of a configuration that introduces the irradiation light 22 including the light source unit 18 and a configuration that detects the reflected light 24 including the detection unit 28 is provided. However, a plurality of pairs of the configurations may be provided to detect the film thickness and depth at a plurality of positions in a radial direction of the upper surface of the wafer 16.

Figure 2:
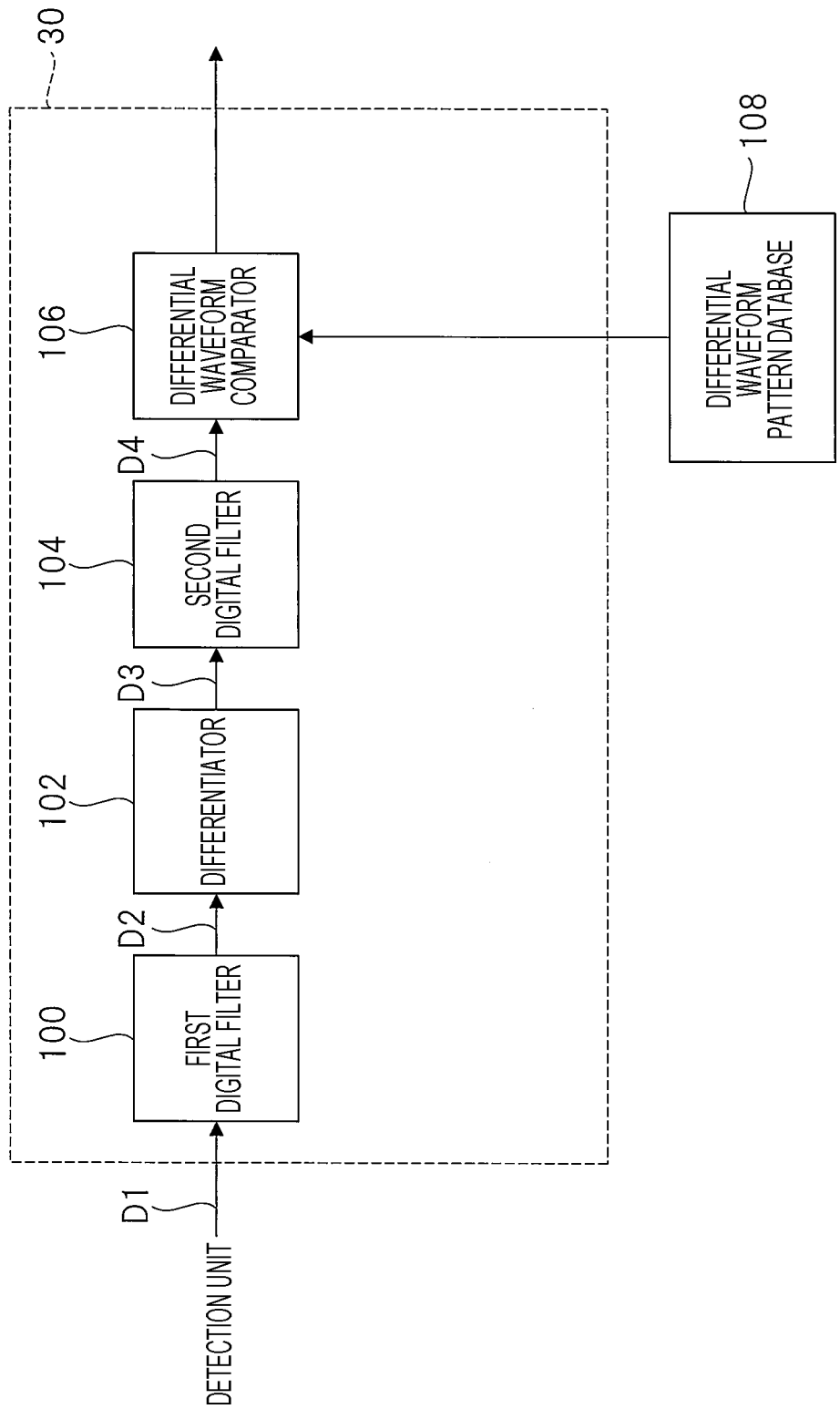
FIG. 2 is a block diagram schematically indicating an outline of a configuration of a film thickness/depth calculation unit according to the embodiment illustrated in FIG. 1.

Data indicating the intensity of the interference light (reflected light 24) from a surface of the wafer 16 at an arbitrary time during processing detected by the detection unit 28 or a change rate of the intensity is transmitted to the film thickness/depth calculation unit 30 communicably connected to the detection unit 28, and the film thickness/depth is calculated in the film thickness/depth calculation unit 30. FIG. 2 indicates the configuration of a functional block of the detection unit 28.

FIG. 2 is a block diagram schematically indicating an outline of a configuration of a film thickness/depth calculation unit 30 according to the embodiment illustrated in FIG. 1.

Time series data d1 of a light amount for each wavelength introduced from the detection unit 28 to the film thickness/depth calculation unit 30 is smoothed by the first digital filter 100 and is supplied to a differentiator 102 as first smoothed time-series data D2.

In the differentiator 102, for example, differential time-series data D3 which is a differential coefficient value (first differential value and second differential value) is calculated by using a Savitzky-Golay method (S-G method) and is supplied to a second digital filter 104. The second digital filter 104 smooths the differential time-series data D3, and second smoothed time-series data D4 is supplied to a differential comparator 106.

Here, calculation of the second smoothed time-series data D4 will be described.

As the first digital filter 100, for example, a second-order Butterworth low-pass filter is used. The first smoothed time-series data D2 is obtained by the following formula by the second-order Butterworth low-pass filter.

$$D2(i)=b1 \cdot D1(i)+b2 \cdot D1(i-1)+b3 \cdot D1(i-2)-[a2 \cdot D2(i-1)+a3 \cdot D2(i-1)]$$

Here, Dk(i) indicates data at a time i of each data Dk, and the values of coefficients b and a are different according to a sampling frequency and a cutoff frequency. Coefficient values of the digital filter are, for example, a2=−1.143, a3=0.4128, b1=0.067455, b2=−0.013491, and b3=0.067455 (sampling frequency 10 Hz, cutoff frequency 1 Hz).

The time-series data D3 of the second order differential value is calculated as follows by the differentiator 102 by using a polynomial fitting smoothing differentiation method of the five time-series data D2.

$$D3(i) = \sum_{j=-2}^{j=2} wj \cdot D2(i+j)$$

Here, w−2=2, w−1=−1, w0=−2, w1=−1, and w2=2 with respect to a weighting coefficient w. By using the time-series data D3 of the differential coefficient, the second smoothed time-series data D4 is calculated as follows by, for example, the second order Butterworth type low pass filter as the second digital filter 104.

$$D4(i)=b1 \cdot D3(i)+b2 \cdot D3(i-1)+b3 \cdot D3(i-2)-[a2 \cdot D4(i-1)+a3 \cdot D4(i-2)]$$

The data D4 introduced to the differential comparator 106 is compared with data indicating the remaining film thickness of a surface of the wafer 16 and the depth of processing which are acquired in advance before processing the wafer 16. The data includes a predetermined pattern selected from a database 108 including a plurality of data indicating a change in a pattern of a differential waveform of intensity with the wavelength of interference light from the wafer 16 as a parameter with respect to a change in time corresponding to the amount of etching processing.

Such database 108 is stored in a storage device such as a semiconductor memory device such as an external storage device such as a hard disk drive (HDD) or a compact disc-read only memory (CD-ROM) disposed in the control unit 40, a random access memory (RAM), or a ROM. Data of a pattern read out by the control unit 40 is transmitted to the film thickness/depth calculation unit 30 which can communicate with the control unit 40 and used for comparison.

The differential waveform comparator 106 compares the data of a pattern at each time included in the data of a pattern selected as a determination criteria from the differential waveform pattern database 108 and the second smoothed time-series data D4 calculated at an arbitrary time targeted to obtain the processing amount.

As a result of this comparison, among data at each time in the reference pattern data, data with the smallest deviation from the second smoothed time-series data D4 is calculated, and the film thickness or depth corresponding to the time at which the deviation is minimized is calculated as the film thickness/depth at an arbitrary time.

The calculated film thickness/depth is transmitted from the film thickness/depth calculation unit 30 to the display device 31 such as a CRT or a liquid crystal monitor, and is displayed or announced.

Furthermore, in this embodiment, if an arithmetic device including a semiconductor device such as a microprocessor of the control unit 40 determines along an algorithm described in software stored in a storage device in advance that the processing amount such as the calculated film thickness and depth becomes a value which reaches the desired value included in the predetermined processing condition before the processing, or a difference from the value falls within an allowable range, a command signal calculated by the arithmetic device of the control unit 40 is transmitted to each unit of the plasma processing apparatus 1. In accordance with the command signal, an electric field generation unit and a magnetic field generation unit including the first high frequency power supply are stopped, operation of the second high frequency power supply for supplying the second high frequency power to an electrode in the sample stand 14 is stopped, the plasma 12 is extinguished, and the etching process is stopped. That is, it is determined that processing has reached an end point of the etching processing.

Then, the adsorption by a static electricity of the wafer 16 is released, the wafer 16 is transferred to the outside of the processing chamber 10, and processing of the next wafer 16 is started as necessary. Alternatively, in response to a command signal transmitted from the control unit 40, an upper limit of the processing such as the composition and supply amount of gas supplied into the processing chamber 10, a pressure in the processing chamber 10, the magnitude of an electric power from the first high frequency power supply, is changed, and the next process step is started on the wafer 16. At this time, the plasma 12 may not be extinguished, and the next process may be started.

The pattern data in the differential waveform pattern database 108 acquired before starting the processing of the wafer 16 is data of pattern indicating a change with respect to a change in time of differentiated waveform of intensity with the wavelength of interference light detected from light from the inside of the processing chamber 10 obtained when another wafer 16 is disposed in the processing chamber 10 to form plasma and processed. The another wafer 16 is a plurality of film layers laminated with the same material and in the same order as those of a film structure to be processed and disposed on a surface of the wafer 16 to be processed, and the wafer 16 has a film structure having a thickness similar to or approximate to the thickness.

Such data may be stored in a storage device before the plasma processing apparatus 1 is installed in a building such as a clean room. Instead of data actually processed on the wafer 16, a value obtained by numerical calculation may be used.

In the case where a first differential value or a second differential value of a light amount change of each wavelength with respect to the film thickness of a target film is acquired in advance, FIG. 2 indicates a method for specifying a film thickness at a time of each detection result by obtaining a first differential value or a second differential value of a light amount for each wavelength with respect to the time and comparing the value and the previously acquired data. However, the method for specifying the film thickness/depth is not limited to the above-described method.

For example, a method may be used in which data on a reflectance of each wavelength of light from a film layer surface with respect to a change in film thickness/depth (or change in processing time) of the film layer to be processed in the film structure is acquired before processing the wafer 16, then the reflectance for each wavelength is calculated by using the result of detecting the reflected light 24 from a film layer of a surface of the wafer 16 during processing and a light amount of each wavelength of emitted external light, the calculated reflectance for each wavelength and the reflectance data acquired in advance are compared, and the film thickness/depth corresponding to the data with the smallest deviation between the reflectances is determined as the film thickness/depth at the time when the reflected light is detected during processing.

In addition, a method may be used in which the film thickness of a target film and light amount data of each wavelength in the case of using external light used for detection are acquired in advance, a light amount for each wavelength is acquired from the detection result, and the film thickness at that time is specified by comparing the light amount with the data acquired in advance.

The operation for detecting the film thickness and depth according to the present invention using such a plasma processing apparatus will be described with reference to FIG. 3.

Figure 3:
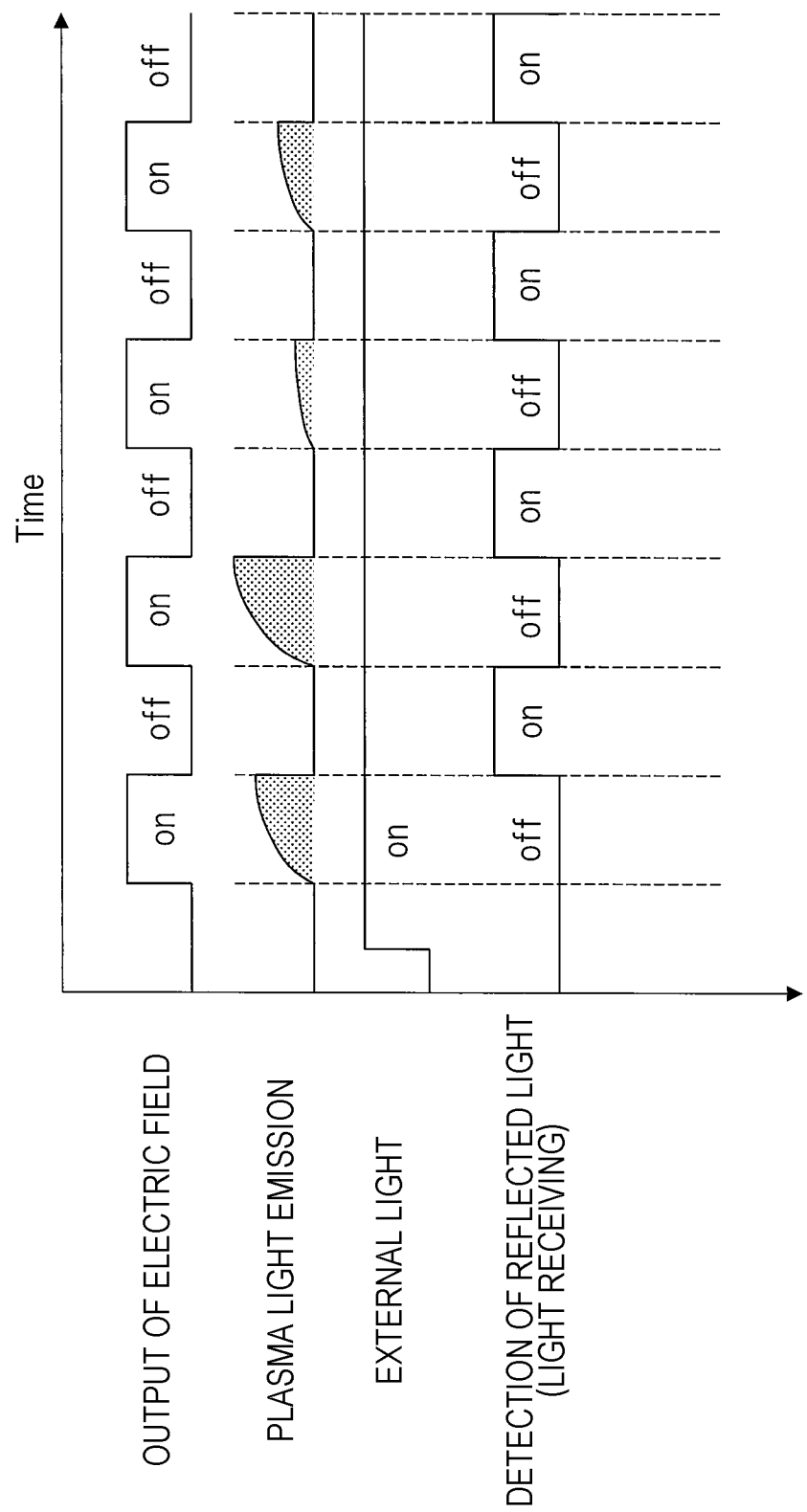
FIG. 3 is a time chart schematically indicating a flow of an operation performed by the plasma processing apparatus illustrated in FIG. 1 for detecting light from the inside of a processing chamber.

FIG. 3 is a time chart schematically indicating a flow of an operation performed by the plasma processing apparatus illustrated in FIG. 1 for detecting light from the inside of a processing chamber.

In this example, the plasma 12 is a pulsed plasma which is ignited, formed, and extinguished in the processing chamber 10 by a pulsed electric field whose supply is turned on/off in a predetermined cycle and period.

The amount of the intensity of light emitted from the plasma 12 fluctuates according to the cycle and the period. External light emitted from a light source in the light source unit 19 outside the processing chamber 10 is emitted onto a surface of the wafer 16 in the processing chamber 10 as reference light with respect to such the plasma 12.

Further, the reflected light 24 reflected from the wafer 16 and the light from the inside of the processing chamber 10 including the light emission of the plasma 12 are repeatedly detected at a predetermined cycle and at a specific time included in the period in which the plasma 12 is switched off.

In the example in the drawing, detection (light reception of lens) of light from the inside of the processing chamber 10 by the detection unit 28 or calculation in the film thickness/depth calculation unit 30 is performed from the start to the end of the period in which the plasma 12 is switched off (start of the on-period of the next plasma 12). However, the invention is not limited to this example.

Light from the processing chamber 10 repeatedly detected at every predetermined cycles is received only from the start time of each cycle to the time when a light amount or information necessary and sufficient to calculate a processing amount is obtained.

In this case, it is sufficient that the external light is emitted at a time of detecting a light from the inside of the processing chamber 10, and in the example of FIG. 3, the case where the external light is constantly emitted during processing is indicated. In this embodiment, light from the inside of the processing chamber 10 is detected through a portion facing the wafer 16 at a predetermined cycle at the time during a period in which the plasma is switched off.

By this detection, the influence of fluctuation of light emission of the plasma 12 which is repeatedly formed and extinguished in a pulse form for detection of the light is reduced, and the accuracy of detecting the processing amount such as film thickness and depth is improved.

In the present embodiment, the plasma 12, irradiation with external light from the light source unit 19, detection of light from the inside of the processing chamber 10 in the detection unit 28, calculation of the processing amount in the film thickness/depth calculation unit 30, and operation timings thereof are adjusted in response to a command signal from the control unit 40.

Hereinafter, specific examples of an operation for performing determination by detecting light from the processing chamber 10 and calculating the processing amount such as the film thickness in the etching processing in the plasma processing apparatus 1 according to the above-described embodiment will be described with reference to FIGS. 4 to 10.

Figure 4:
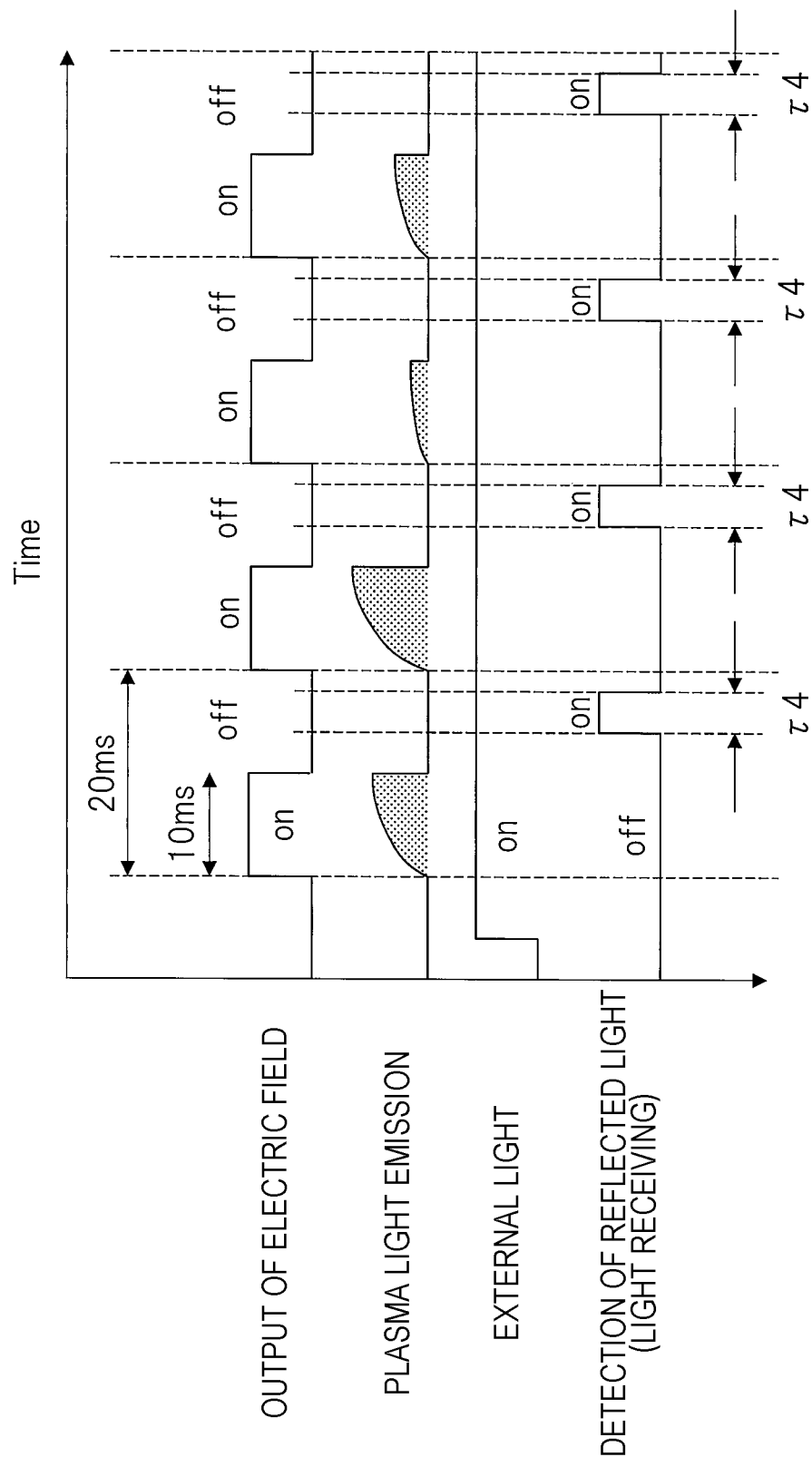
FIG. 4 is a time chart schematically indicating an example of an operation flow for calculating and determining a processing amount such as film thickness by detecting light from the processing chamber during processing in the plasma processing apparatus according to the embodiment indicated in FIG. 1.
Figure 5:
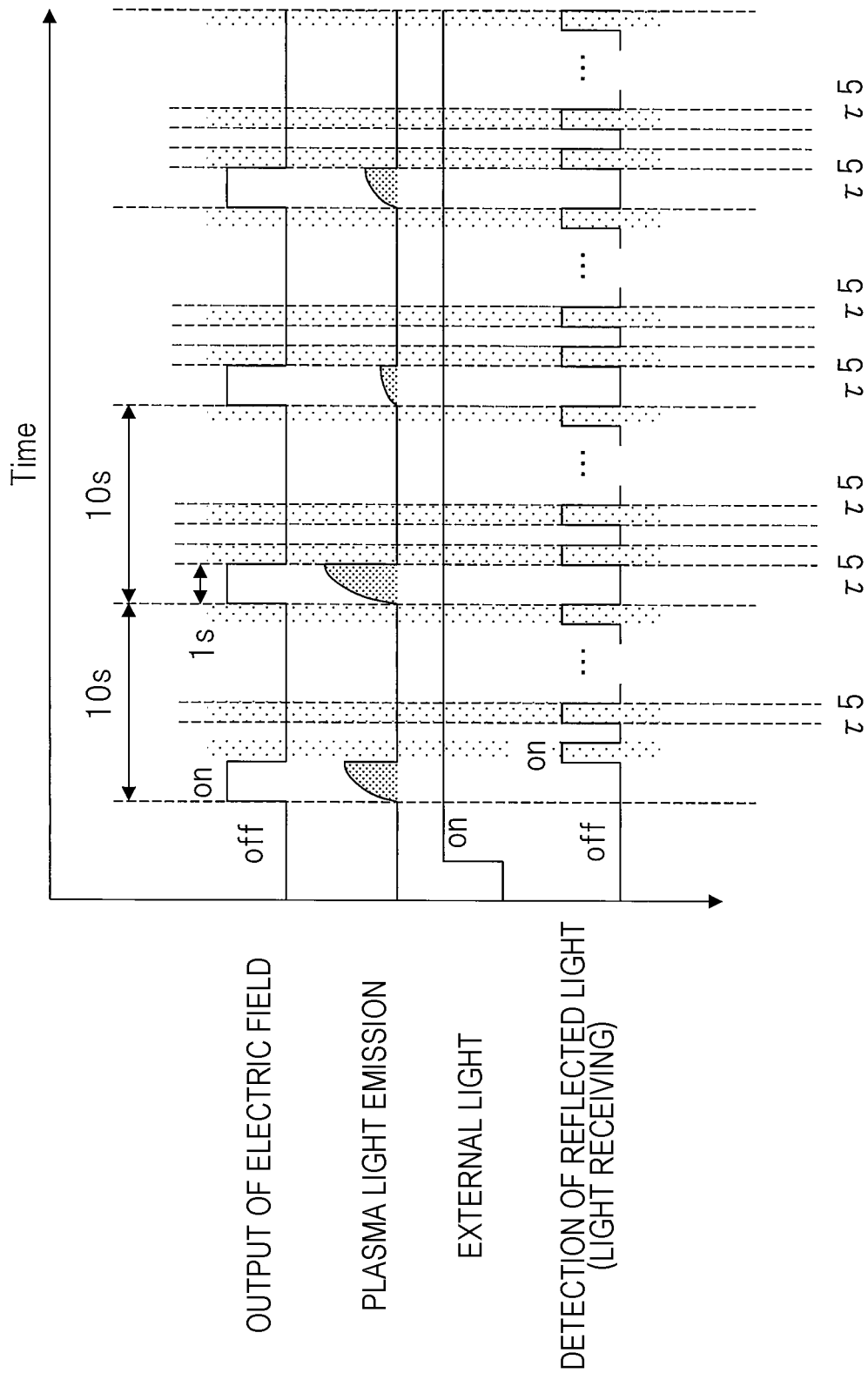
FIG. 5 is a time chart indicating another example of FIG. 4.
Figure 6:
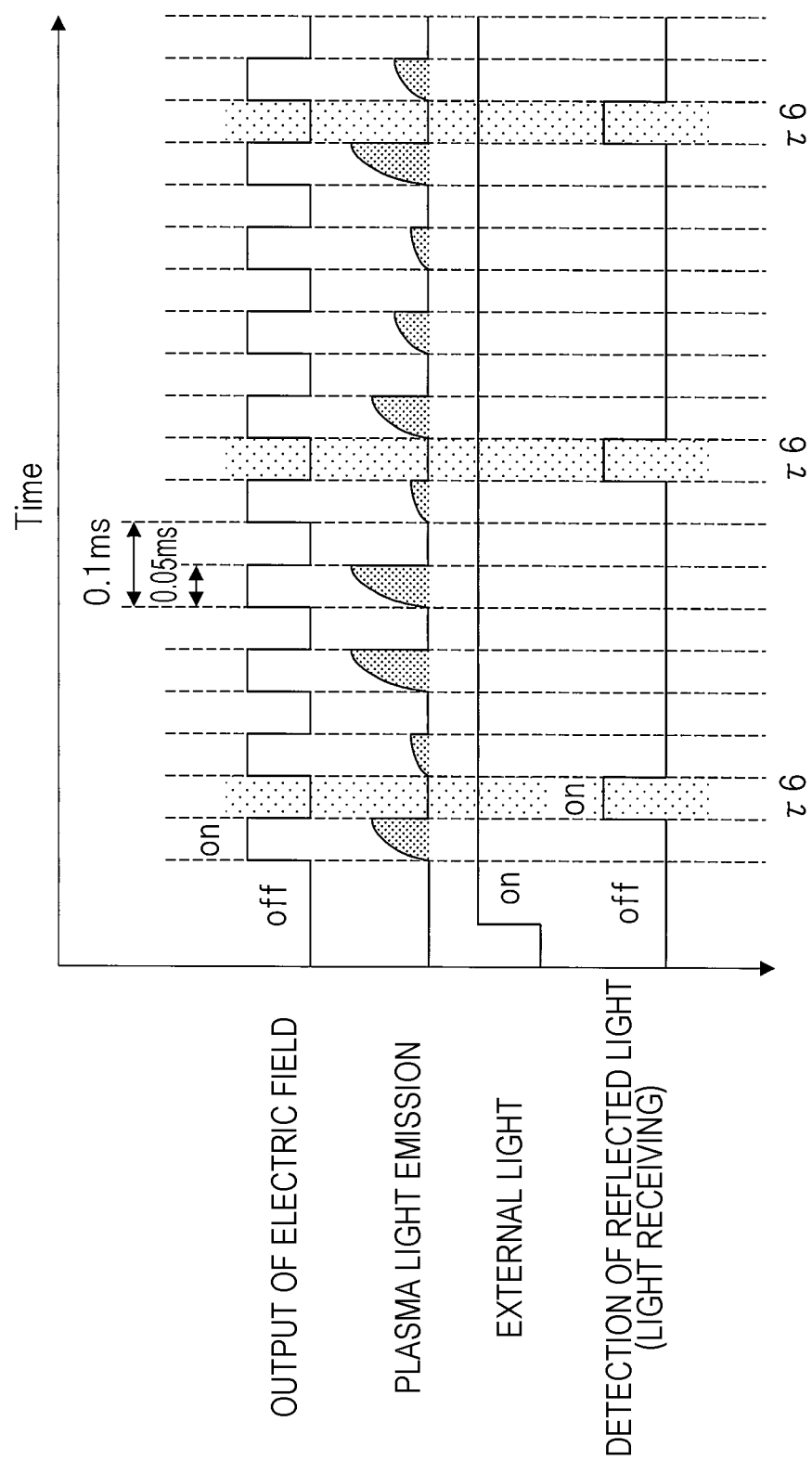
FIG. 6 is a time chart indicating another example of FIG. 5.

FIGS. 4 to 6 are time charts schematically indicating an example of an operation flow for performing determination by calculating a processing amount, such as film thickness, by detecting light from the processing chamber during processing in the plasma processing apparatus according to the embodiment indicated in FIG. 1.

In the example illustrated in FIG. 4, the plasma on-period of the plasma 12 is set to 10 ms, the cycle (frequency) of the plasma on/off is set to 50 Hz, and light from the processing chamber 10 is detected in one predetermined cycle per off-period of each plasma 12.

A continuous light source of ultraviolet light to infrared light, for example, a xenon light source or a white LED light source, is used as a light source of the light source unit 18 in this example, and the wafer 16 is constantly irradiated through the lens 20 from the light source unit 18 during the processing period.

Further, in the detection unit 28, light from the inside of the processing chamber 10 received for a specific time period for each cycle is divided into a plurality of wavelengths by using a spectroscope and is transmitted to the film thickness/depth calculation unit 30. In the calculation unit 30, the intensity for each wavelength and the differential value for that time are detected, and a processing amount is calculated or determined as in FIG. 2.

Figure 14A:
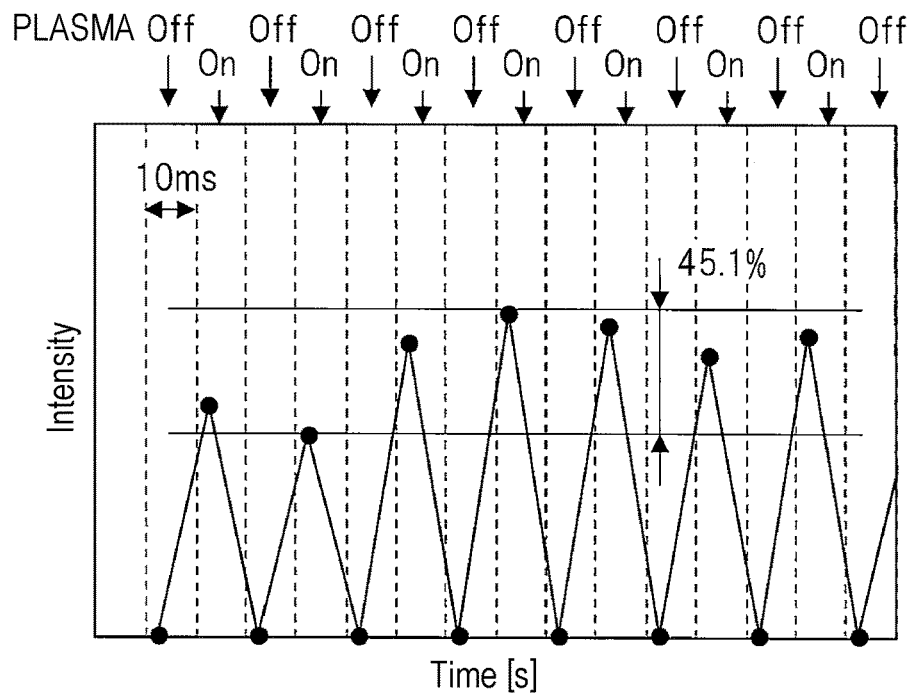
FIGS. 14A and 14B are graphs schematically indicating a change in the intensity of plasma light emission with respect to a change in time detected during a period of etching processing of a sample to be processed in the plasma processing apparatus as studied by the inventors of the present invention.
Figure 14B:
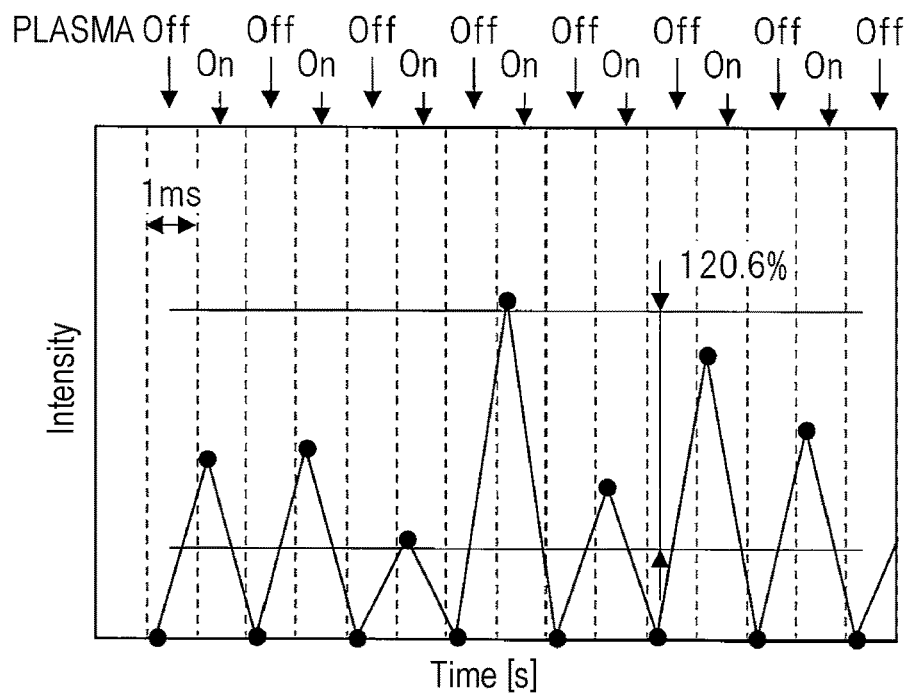

At the timing of detection of light from the processing chamber 10 according to the example indicated in FIG. 4, since the on-period of the plasma 12 is 10 ms, in addition to the instability of a matching unit operating after the plasma is switched on, the instability of a short time constant (to several tens of milliseconds), such as electron temperature, electron density, gas divergence, and gas density of the plasma 12 is included. As in the technical example indicated in FIG. 14A, the light emission immediately after the time of starting each on-period of the plasma 12 fluctuates.

In response to such light emission of the plasma 12, in this example, external light is emitted to the processing chamber 10 for a specific time τ4 from a predetermined time during the off-period of the plasma 12, and the reflected light 24 from the wafer 16 is detected.

With this configuration, the reflected light 24 detected at τ4 does not include a light emission component of the plasma 12 in which intensity is changed in every on-period, or a temporal change profile is different for each period. Alternatively, it is small enough to be regarded as the above, and the influence of fluctuation of the intensity of the light emission of the plasma 12 with respect to information on light from a surface of the detected wafer 16 is remarkably suppressed.

As a result, in this example, it is possible to detect the processing amount such as remaining film thickness/depth during processing or determine an end point of the processing with high accuracy. In addition, in this example, the film thickness and the depth of processing are detected in every cycle of the off-period of the plasma 12 (at intervals of 10 ms), and temporal fluctuation of these processing amounts during plasma processing can be detected with high accuracy.

Here, in the above-described embodiment, as a technique for calculating the film thickness/depth, a differential value with respect to a time of the intensity of light for each of a plurality of wavelengths from the inside of the processing chamber 10 is used. However, this is not limited thereto, and it is possible to detect the film thickness and depth by using such as a light amount for each wavelength of light from the processing chamber 10 and a reflectance for each wavelength.

Figure 10:
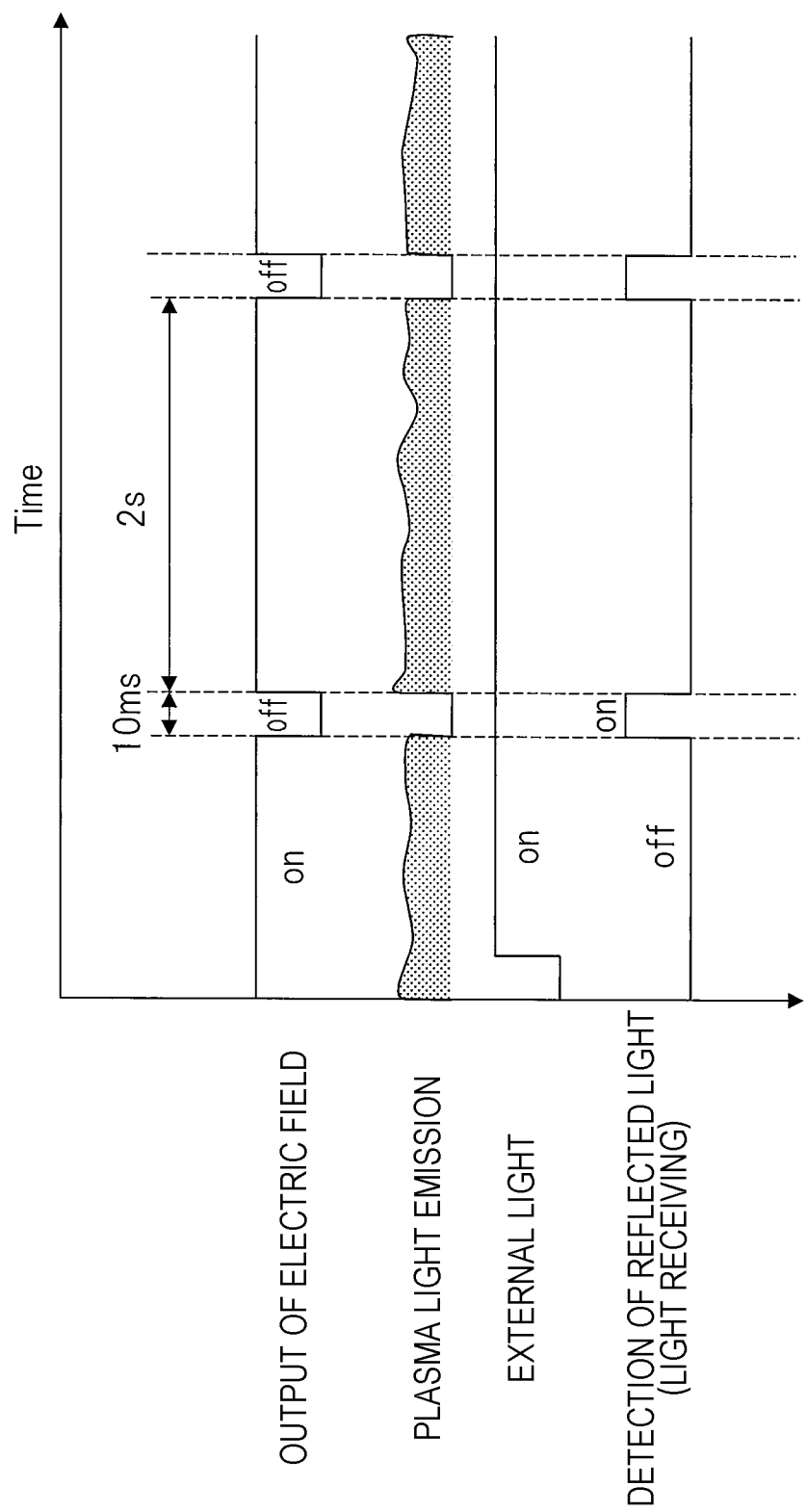
FIG. 10 is a time chart schematically indicating an example of an operation flow for calculating and determining a processing amount such as film thickness by detecting light from the processing chamber during processing in the plasma processing apparatus according to the embodiment indicated in FIG. 1.
Figure 11:
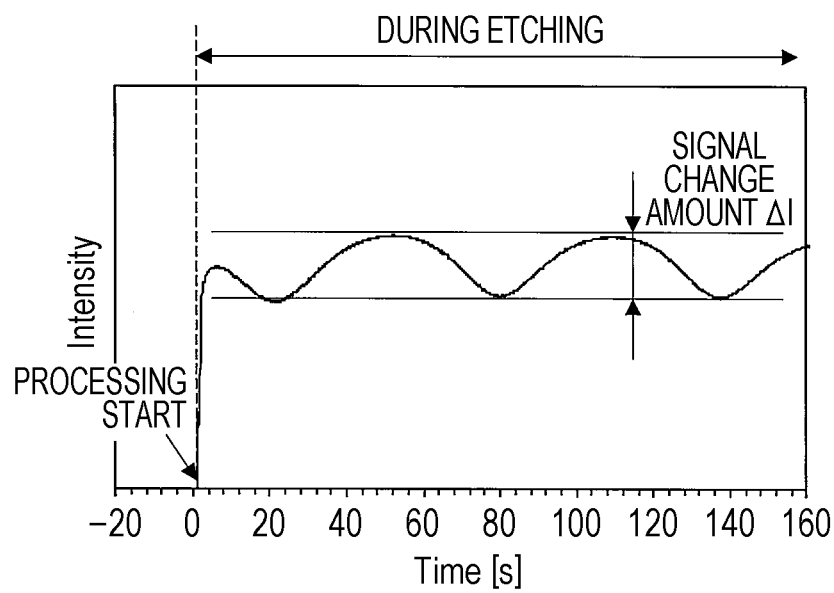
FIG. 11 is a graph schematically indicating a change in the intensity of plasma light emission with respect to a change in time detected during a period of etching processing of a sample to be processed in a plasma processing apparatus as studied by the inventors of the present invention.

Further, as indicated in FIG. 10, as the plasma 12 is supplied such that an electric field continues intermittently on/off of an electric field, even in the case where the off-period of 10 ms is inserted every on-period continuing 2 s, and the on/off are intermittently continued, it is possible to calculate the film thickness/depth and determine the processing amount by using the result of detecting the reflected light 24 obtained by irradiating the processing chamber 10 with external light during the off-period.

FIG. 10 is a time chart schematically indicating an example of an operation flow for calculating and determining a processing amount such as film thickness by detecting light from the processing chamber during processing in the plasma processing apparatus according to the embodiment indicated in FIG. 1.

A difference from the example indicated in FIG. 4 is that the off-period of 10 ms is inserted in every on-period in which the plasma 12 continues for 2 s, and the on/off are intermittently continued. The example in this drawing indicates an example of the plasma processing apparatus 1 indicated in FIG. 1 which is the same as the embodiment according to FIG. 4 except for this point.

In this drawing, since the plasma on-time is 2 s, the intensity of light emission of the plasma 12 is regarded as equivalent to the variation in a plasma stable state mainly indicated in FIG. 12. In response to the plasma 12, in this example, external light from the light source unit 18 is emitted into the processing chamber 10 during the off-period of the plasma 12, and the reflected light 24 from the wafer 16 is detected.

As in FIG. 4, the reflected light 24 detected in this manner does not include a light emission component of the plasma 12 in which intensity is changed in every on-period, or a temporal change profile is different for each period. Alternatively, it is small enough to be regarded as the above, and the influence of fluctuation of the intensity of the light emission of the plasma 12 with respect to information on light from a surface of the detected wafer 16 is remarkably suppressed.

An example indicated in FIG. 5, as in FIG. 4, indicates a time chart schematically indicating an example of an operation flow for calculating and determining a processing amount such as film thickness by detecting light from the processing chamber during processing. The example in the drawing differs from the example indicated in FIG. 4 in that the plasma on-time of the plasma 12 is set to 1 s, the on/off cycle (frequency) is set to 0.1 Hz, and light emitted from the inside of the processing chamber 10 is detected a plurality of times during each off-period between a predetermined period τ5. The configuration other than this point is the same as the configuration indicated in FIG. 4.

In this example, since the on-period of the plasma 12 is 1 s, the variation of the intensity of light emission of the plasma 12 is equivalent to the variation in a stable state of the plasma 12 indicated in FIG. 12. In addition, during the off-period of the plasma 12, external light is emitted on an upper surface of the wafer 16 in the processing chamber 10 to detect the reflected light 24. In this case, detection of the reflected light 24 during the off-period of 9 s is performed a plurality of times at predetermined intervals, and these are performed in each off-period.

The time between a start time of detection of the last reflected light 24 in an arbitrary off-period in this example and the start time of detection of the first reflected light 24 in an off-period immediately after the start time is equal to a plurality of detection cycles in each off-period. That is, over a plurality of intermittent and continuous off-periods of the plasma 12, the start time and duration for detecting the reflected light 24 are a predetermined period and a period τ5.

In this manner, the reflected light 24 detected during the period τ5 for each period does not include a light emission component of the plasma 12 in which the intensity is changed in every on-period, or a temporal change profile is different for each period. Alternatively, it is small enough to be regarded as the above, and the influence of fluctuation of the intensity of the light emission of the plasma 12 with respect to information on light from a surface of the detected wafer 16 is remarkably suppressed.

As a result, in this example, it is possible to detect the processing amount such as remaining film thickness/depth during processing or determine an end point of the processing with high accuracy. In addition, in this example, detection is performed a plurality of times during one off-period of the plasma 12. Therefore, by averaging these data, it is possible to reduce electric noise or the like of a detection system, and further highly accurate film thickness/depth detection can be realized.

An example indicated in FIG. 6, as in FIG. 4, indicates a time chart schematically indicating an example of an operation flow for calculating and determining a processing amount such as film thickness by detecting light from the processing chamber during processing.

The difference between the examples of FIGS. 4 and 5 and the example in this drawing is that the plasma on-time of the plasma 12 is set to 0.05 ms, the plasma 12 on/off frequency is set to 10 kHz, and the reflected light 24 is detected from the processing chamber 10 once in the predetermine time in each off period.

In this example, the configuration other than this point is the same as the configurations indicated in FIGS. 4 and 5. However, in this example, a spectroscope included in the detection unit 28 cannot perform data sampling at a speed of 10 kHz, and can perform data sampling at 2.5 kHz.

FIG. 6 indicates the timing of detecting light from the inside of the processing chamber 10 in this example. Since the on-period of the plasma 12 is 0.05 ms, the intensity of light emission of the plasma 12 after start of the on-period varies due to other factors having short time constants such as electron temperature, electron density, and gas dissociation and density, in addition to variation of a matching device.

On the other hand, the period (frequency) of the off period of the plasma 12 is 10 kHz, whereas the spectroscope included in the detection unit 28 according to this example cannot perform detection with high accuracy at a cycle of 10 kHz.

Therefore, in this example, the spectrometer is operated at a cycle of 2.5 kHz, which is ¼ of the on/off frequency of the plasma 12, to detect the received light.

With this configuration, at every fourth times of the off-period of the plasma 12, in other words, at the time during the off-period corresponding to the cycle of four times of the off-period cycle, external light is emitted and the reflected light 24 is detected for the period τ6, and these are repeated multiple times during processing of the wafer 16.

The reflected lights 24 are all detected during the off-period of the plasma 12. In this example, at intervals of 0.4 ms which is a cycle four times the off-period of the plasma 12, by using the reflected light 24 detected during the period τ6, the film thickness and depth of a film layer on a surface of the wafer 16 at a start time of the period τ6 or at any time representing the period τ6 are calculated with high accuracy, and the processing amount such as an end point is determined.

Next, operations in variations of the embodiment indicated in FIGS. 4 to 6 will be described with reference to FIGS. 7 to 9.

First Variation

Figure 7:
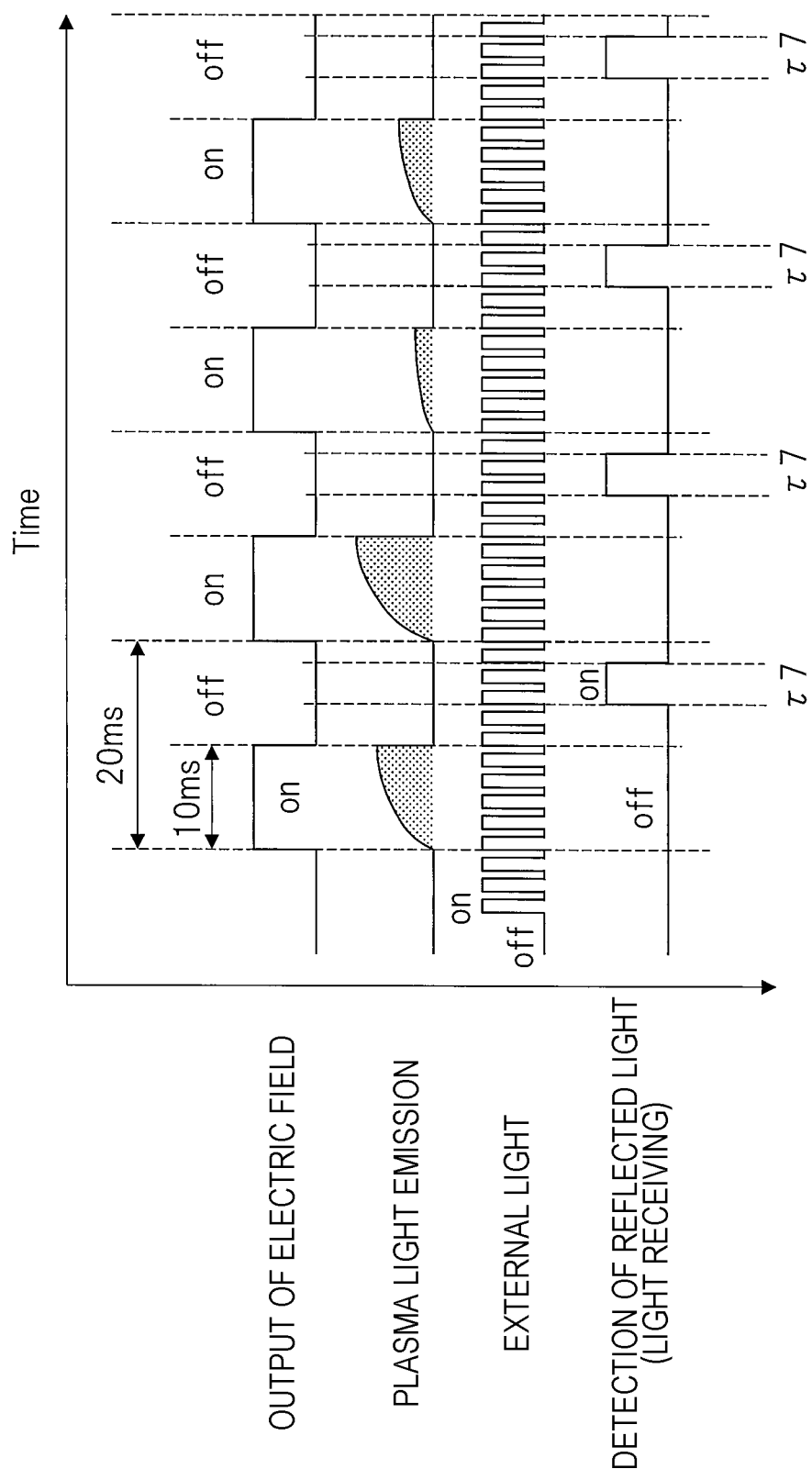
FIG. 7 is a time chart schematically indicating an example of an operation flow for calculating and determining a processing amount such as film thickness by detecting light from the processing chamber during processing in a plasma processing apparatus according to a variation of the embodiment indicated in FIG. 1.

FIG. 7 is a time chart schematically indicating an example of an operation flow for calculating and determining a processing amount such as film thickness by detecting light from the processing chamber during processing in a plasma processing apparatus according to a variation of the embodiment illustrated in FIG. 1.

In this variation, as in the above-described embodiment, in the plasma processing apparatus 1 in which the pulsed plasma 12 is formed in the processing chamber 10, by using a light source with a specific wavelength as an external light source, such as a semiconductor laser, the external light is modulated at a high frequency, for example, 600 MHz, and emitted to a wafer.

Here, the semiconductor laser may fluctuate in wavelength (mode hop) depending on a return light to a laser emitting end face or a temperature change of the laser. To reduce the influence of this mode hop, the laser is modulated at high frequencies. Regarding other than these, the same configuration as in the first embodiment is used.

In this example, since the on-period of the plasma 12 is 10 ms, the intensity of light emission fluctuates due to various unstable factors after starting the on-period of the plasma 12. For such the plasma 12, during the off-period in the present embodiment, external light from the light source unit 19 by a semiconductor laser is emitted into the processing chamber 10 from the wafer 16 to detect the reflected light 24 during the period $\tau 7$ at every predetermined period.

Here, a detection cycle is the same as a cycle of the off-period of the plasma 12 (on/off cycle of the plasma 12), and the laser light is modulated at high frequencies. However, a modulation cycle (frequency) is 1000 times shorter (frequency is higher) than a cycle (frequency) for detecting the reflected light 24. Therefore, the influence on variation in the intensity as a result of detecting the reflected light 24 by modulation of the external light can be made small enough to be regarded as negligible.

Also in this example, with such a configuration, it is also possible to realize highly accurate film thickness/depth detection by suppressing the influence of variation of the intensity of light emission of the plasma 12 for detection of the reflected light 24 from a surface of the wafer 16.

Second Variation

Figure 8:
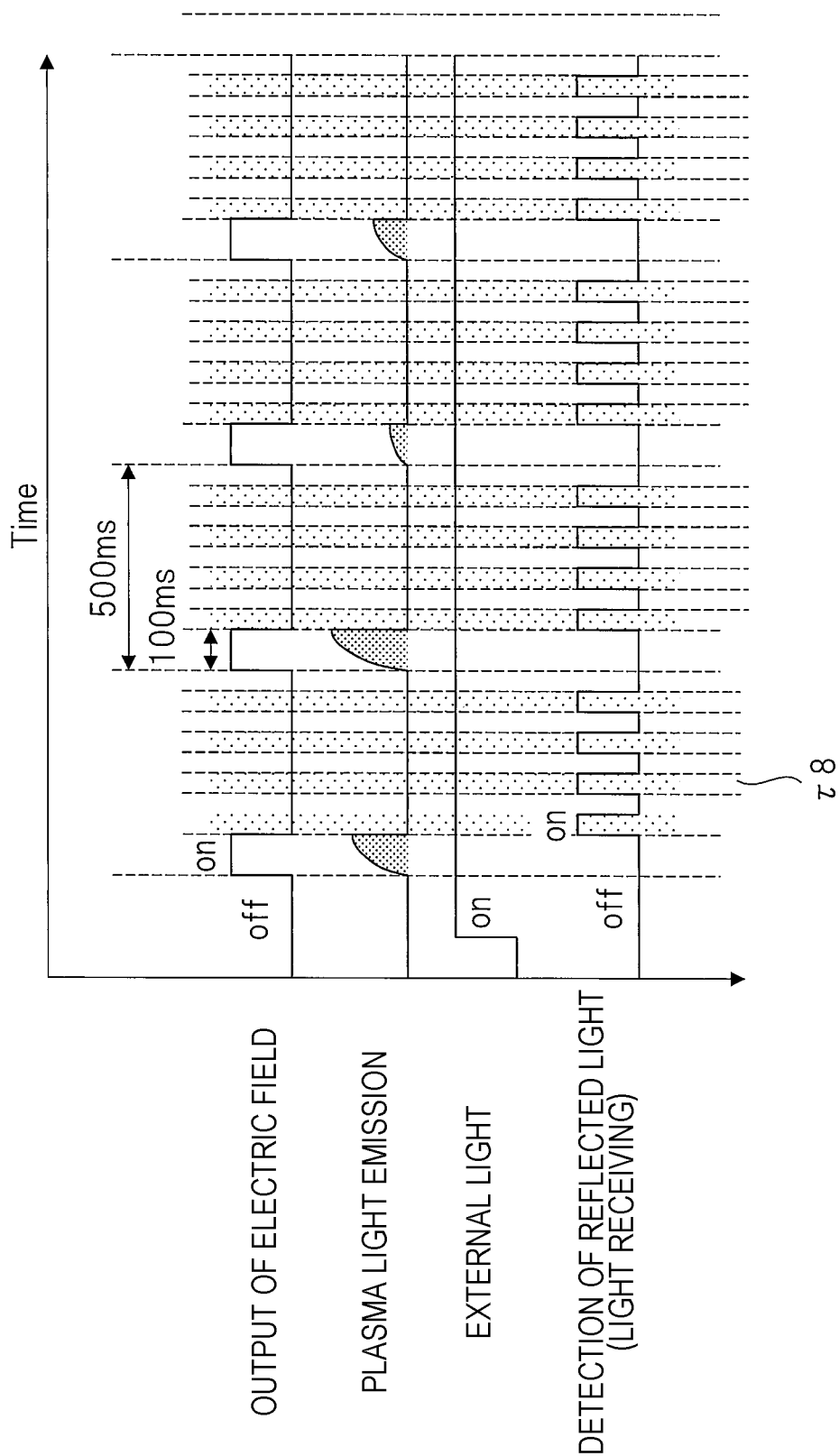
FIG. 8 is a time chart schematically indicating an example of an operation flow for calculating and determining a processing amount such as film thickness by detecting light from the processing chamber during processing in a plasma processing apparatus according to another variation of the embodiment indicated in FIG. 1.

FIG. 8 is a time chart schematically indicating an example of an operation flow for calculating and determining a processing amount such as film thickness by detecting light from the processing chamber during processing in a plasma processing apparatus according to another variation of the embodiment illustrated in FIG. 1.

In this variation, during the off-period of the pulsed plasma 12 in the processing chamber 10 in the same manner as in the above embodiment, particles in the processing chamber 10 are deposited on a surface of the film structure of the wafer 16, and growth occurs to form a film, and together with the film formed in the off-period during the on-period of the plasma 12, a film layer to be processed of the film structure on the surface of the wafer 16 is etched.

In the plasma processing apparatus 1 according to this example, during the processing, the processing amount such as a remaining film thickness and etching depth of the film layer to be processed is detected, or an end point of the processing is determined.

With the plasma 12 in this example, external light from the light source unit 19 is emitted into the processing chamber 10 with the on-period set to 100 ms and the on/off cycle (frequency) set to 2 Hz. In this example, the reflected light 24 of the external light from the wafer 16 is repeatedly detected a plurality of times at predetermined intervals during each off-period.

Further, an interval between the end time of the last detection period $\tau 8$ in an arbitrary off-period and the start time of the first detection period $\tau 8$ in the next off-period may not coincide with (or may be different from) the common detection cycle during the off-periods. Except for these points, the configuration is the same as the example indicated in FIG. 4.

In this example, since the on-period of the plasma 12 is 100 ms, after the on-period starts, light emission of the plasma 12 varies due to various unstable factors during the period. In the embodiment, external light is continuously emitted into the processing chamber 10 over a plurality of on/off periods of the plasma 12, and the reflected light 24 of the external light from a surface of the wafer 16 is detected a predetermined number of plurality of times during the off-period of a plurality of plasmas 12 in the detection unit 28.

Further, in this configuration, the influence of fluctuation of the intensity of light emission of the plasma 12 with respect to the detection of the reflected light 24 from the surface of the wafer 16 is suppressed, and highly accurate film thickness/depth detection is realized.

Here, at each of a plurality of detections during the off-period of the plasma 12, in each period $\tau 8$ during which the reflected light 24 is detected, the processing amount such as film thickness and depth corresponding to the start time or the time representing the period $\tau 8$ is calculated.

These film thicknesses and depths reflect the film thickness and average structure (such as unevenness) of deposited films growing during the off-period, and by performing such detection, the deposition state of the films during the plasma off-period can be monitored.

It is also possible to monitor film thickness/depth changes of a wafer by monitoring the same timing of a plurality of detections during each plasma off-period or the film thickness/depth of the average value.

Third Variation

Figure 9:
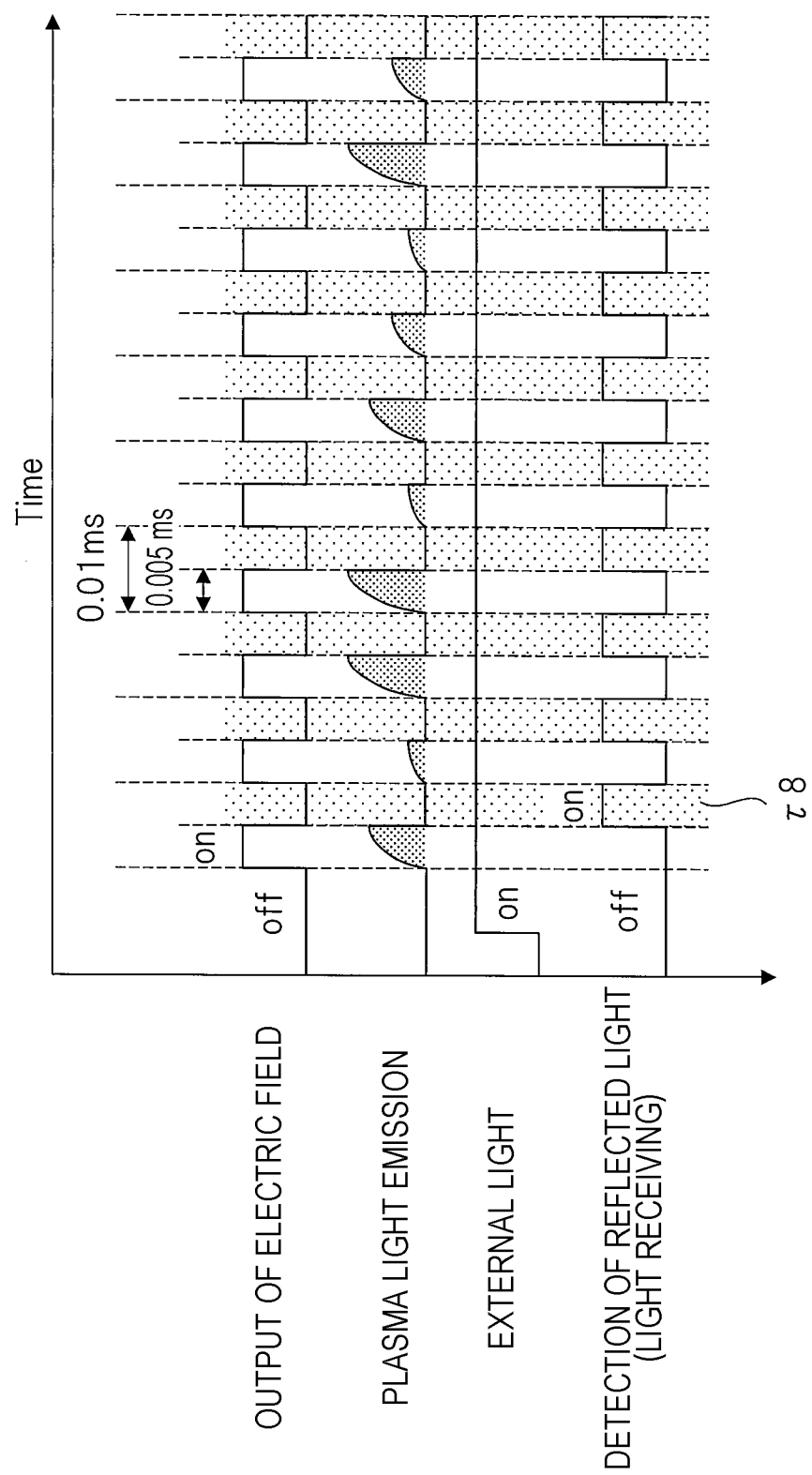
FIG. 9 is a time chart schematically indicating an example of an operation flow for calculating and determining a processing amount such as film thickness by detecting light from the processing chamber during processing in a plasma processing apparatus according to another variation of the embodiment indicated in FIG. 1.

FIG. 9 is a time chart schematically indicating an example of an operation flow for calculating and determining a processing amount such as film thickness by detecting light from the processing chamber during processing in a plasma processing apparatus according to another variation of the embodiment illustrated in FIG. 1.

In this example, as in the above-described embodiment, the on-period of the pulsed plasma 12 in the processing chamber 10 is set to 5 μs and the frequency (cycle) of on/off is set to 100 kHz, and light from the inside of the processing chamber 10 is repeatedly detected at a predetermined cycle. The detection of the predetermined period $\tau 9$ is performed once for each plasma off-period.

As a light source provided in the light source unit 18 in this example, a light source of a specific wavelength, for example, a gas laser, is used and is emitted continuously downward from a position opposed to an upper surface of the wafer 16 during the processing period. A photodetector is used as a detector provided in the detection unit 28. With this configuration, the detection unit 28 is configured to perform data sampling at high speed. The configuration other than these points is made equivalent to the example indicated in FIG. 4.

In the example of this drawing, the on-period of the plasma 12 is 5 μs (0.005 ms). Therefore, the intensity of light emission of the plasma significantly fluctuates in each on-period under the influence of various unstable factors after starting the on-period. With respect to such plasma 12, in this example, during the off-period, the reflected light 24 from a surface of the wafer 16 of external light emitted from the light source unit 19 into the processing chamber 10 for the time $\tau 9$ of the same length as the period during the off-period. With this configuration, it is possible to achieve the same action as the above-described embodiment or variations.

Here, in this example, since monochromatic light is used as external light, the detection unit 28 does not need to perform spectroscopy by a spectroscope. Therefore, the detection unit 28 does not perform spectroscopy, and a photodetector is used as a detector that detects the intensity of received light.

With this configuration, it is possible to perform detection in accordance with the start and end of each off-period even for on/off switching (modulation) of the plasma 12 at high speed of 100 kHz, and a change in film thickness can be detected in a short cycle.

According to the above embodiment and variations, it is possible to suppress the influence of fluctuation of intensity of light from a surface of the wafer 16 or the intensity of light emission of the plasma 12 with respect to information indicating a change in the intensity and detect the processing amount such as remaining film thickness/depth during processing or determine an end point of the processing with high accuracy.

As a result, it is possible to provide a plasma processing apparatus with high yield.

It should be noted that the above-described examples are merely an example of the present embodiment, and the present embodiment is not limited to the examples.

The invention by the present inventor has been specifically described above based on the embodiments. However, the present invention is not limited to the embodiments, and can be changed variously without departing from the gist of the invention.

What is claimed is:

1. A plasma processing method that processes a film layer to be processed disposed in advance on a surface of a sample disposed and held on a sample stand disposed inside a processing chamber inside a vacuum vessel, by using plasma repeatedly being switched on and off in the processing chamber in predetermined cycles and periods, the plasma processing method comprising:

detecting, a plurality of times, an amount indicating the intensity of light from the sample surface at a predetermined cycle in a period during which the plasma is switched off while the sample is being processed;

detecting a processing amount of the film layer on the sample surface by using only data obtained from the detection in the step of detecting the amount indicating the intensity of light in the period during which the plasma is switched off; and changing conditions of the processing based on the detected processing amount in the detecting the processing amount of the film layer on the sample surface.

2. The plasma processing method according to claim 1, wherein in the detecting the intensity of light, an amount indicating the intensity of light emitted from the outside of the processing chamber and reflected by the sample surface in a period during which the plasma is switched off while the sample is being processed is detected.

3. The plasma processing method according to claim 1, wherein in the detecting the intensity of light, the amount indicating the intensity of light from the sample surface at least once in a period during which the plasma is switched off while the sample is being processed at predetermined cycles over a plurality of periods in which the plasma is switched off is detected.

4. The plasma processing method according to claim 1, wherein in the detecting the processing amount, the processing amount of the film layer on the sample surface is detected by using a result of averaging data obtained by detecting a plurality of times an amount indicating the intensity of light from the sample surface at predetermined cycles in each of periods during which the plasma is switched off while the sample is being processed.

5. The plasma processing method according to claim 1, further comprising determining an end point of the processing by using a result of detecting the processing amount of the film layer on the sample surface, in the detecting the processing amount.

* * * * *